(12) United States Patent
Hanzawa et al.

(10) Patent No.: US 7,388,768 B2
(45) Date of Patent: Jun. 17, 2008

(54) SEMICONDUCTOR DEVICE

(75) Inventors: Satoru Hanzawa, Hachioji (JP);
Riichiro Takemura, Tokyo (JP);
Kazuhiko Kajigaya, Iruma (JP)

(73) Assignees: Hitachi, Ltd., Tokyo (JP); Elpida Memory, Inc., Tokyo (JP)

( * ) Notice: Subject to any disclaimer, the term of this patent is extended or adjusted under 35 U.S.C. 154(b) by 217 days.

(21) Appl. No.: 11/354,131

(22) Filed: Feb. 15, 2006

(65) Prior Publication Data

US 2006/0193160 A1    Aug. 31, 2006

(30) Foreign Application Priority Data

Feb. 17, 2005    (JP)    ............... 2005-040885

(51) Int. Cl.
*G11C 15/00*    (2006.01)
(52) U.S. Cl. ............... 365/49; 365/189.06; 365/189.07; 365/233
(58) Field of Classification Search .......... 365/49, 365/189.06, 189.07, 233
See application file for complete search history.

(56) References Cited

U.S. PATENT DOCUMENTS 6,373,738 B1 *  4/2002  Towler et al. ............ 365/49
7,057,912 B2 *  6/2006  Hanzawa et al. ......... 365/49
2003/0179623 A1    9/2003  Inoue

FOREIGN PATENT DOCUMENTS

JP    2003-272386    3/2002

OTHER PUBLICATIONS

Satoru Hanzawa et al., "A Dynamic CAM—Based on a One-Hot-Spot Block Code—For Millions-Entry Lookup", 2004 Symposium on VLSI Circuits, Digest of Technical Papers, (2004 IEEE), pp. 382-385.

* cited by examiner

*Primary Examiner*—Pho M. Luu
(74) *Attorney, Agent, or Firm*—Reed Smith LLP; Stanley P. Fisher, Esq.; Juan Carlos A. Marquez, Esq.

(57) ABSTRACT

Control clocks of different phases are distributed to a memory array divided into multiple banks, and processing of entries and search keys (read and write operations and search operation) is performed at different phases. The memory array divided into banks is further divided into smaller arrays, that is, sub-arrays, and a sense amplifier in a read-write-search circuit block is shared by the two sub-arrays. In this case, a so-called open bit line structure in which each one bit line is connected from both sub-arrays to a sense amplifier is adopted. The same look-up table is registered to multiple banks, successively inputted search keys are sequentially inputted to the multiple banks, and the search operation is carried out in synchronization with the control clocks of different phases.

5 Claims, 15 Drawing Sheets

BK1,BK2 : Bank
SARYU,SARYL : Sub Array
RWSBK : Read-Write-Serch Circuit

→ : PATH OF PACKET PCT
⋯▸ : PATH OF HEADER FIELD

SEMICONDUCTOR DEVICE

CROSS-REFERENCE TO RELATED APPLICATION

The present application claims priority from Japanese Patent Application No. JP 2005-040885 filed on Feb. 17, 2005, the content of which is hereby incorporated by reference into this application.

TECHNICAL FIELD OF THE INVENTION

The Present invention relates to a semiconductor device. More particularly, it relates to a technology effectively applied to a semiconductor device provided with a content addressable memory (CAM) array which stores and compares information encoded in the device, in a semiconductor device including a content addressable memory cell (CAM cell) which compares information stored in a storage node with inputted information.

BACKGROUND OF THE INVENTION

With the explosive growth of the Internet, the table scale required for routers and switches in a network has been rapidly increasing, and the speed-up of table search has been demanded. As means for solving this problem from the aspect of hardware, a ternary content addressable memory (TCAM) attracts a lot of attention.

For example, Japanese Patent Application Laid-Open Publication No. 2003-272386 (Patent Document 1) discloses a structure of the TCAM cell using two dynamic storage cells for storing three values of '0'/'1'/'X' (don't care). By this structure, the occupied area of the cell can be reduced and the increase in capacity can be achieved, and at the same time, low power consumption and speed-up of search operation can be achieved.

In addition, for example, "IEEE 2004 Symposium on VLSI Circuits, Digest of Technical Papers" June 2004, pp. 382 to 385 (Non-patent Document 1) discloses an encoding method of entry or search key and a memory array structure to achieve the CAM which can solve the problems of capacity shortage and increase in power consumption in the TCAM. In this technology, an encoding method called one-hot-spot block code is used.

In the TCAM, "entry" is usually used as a term that corresponds to "word" popularly used in a DRAM and a SRAM. Since "entry" is the term which indicates information stored in each "word", the storage information is called "entry" and comparison information is called "search key" in accordance with customary practice in this specification.

SUMMARY OF THE INVENTION

Inventors of the present invention have studied the speed-up of the CAM using a one-hot-spot Block code prior to the present application. Note that inventors of the present invention have filed a publicly-unknown "Japanese Patent Application No. 2003-429505" (hereinafter, referred to as Reference Document 1) and a publicly-unknown "Japanese Patent Application No. 2004-169314" (hereinafter, referred to as Reference Document 2) in relation to the CAM using a one-hot-spot Block code prior to the present application. The inventors of the present invention have studied a search time required for search operation of a memory array in detail including these technologies, and have found the following two problems, and others.

The first problem lies in that the degree of shortening of the search time in the search operation of a memory array, which is the heart of the CAM, is predicted to be small because performance improvement of a semiconductor device is slow in comparison with the line speed which has been improved at a pace as much as 1000 times in 10 years in the communication field where the CAM is primarily applied. Some CAM vendors release on the Web a method to improve the number of searches per unit time by applying several kinds of masks to one search key and carrying out search operations in different look-up tables. However, since a plurality of CAMs are required for carrying out packet transfer processing while maintaining the line speed, there is a possibility that the packaging cost is increased. In order to suppress the packaging cost, parallel processing is desirable, in which search keys sequentially inputted into the CAM are used at different phases to perform the search.

In order to achieve the processing as described above, in FIG. 11 of the above-mentioned patent document 1, a so-called interleave method is shown, in which the same look-up table is stored in the ternary content addressable memory cell array (TCAM cell array) divided into two, and search keys are inputted alternately to them to carry out the search operation. In addition, as the detailed memory array structure thereof, in FIG. 12 of patent document 1, a so-called folded bit-line structure is shown, in which a sense amplifier is shared between TCAM cell arrays and a bit line pair connected to each sense amplifier exists in the same TCAM cell array. Also, the above-mentioned two dynamic storage cells are connected to this bit line pair.

However, in the folded bit-line structure, information of a logical value "00" or a logical value "11" cannot be accurately read from or written to storage nodes of the two dynamic storage cells. Furthermore, in the case of dynamic cells, re-store operation for refresh cannot be correctly carried out. In order to prevent the malfunction, it is desirable that a sense amplifier arrangement of a so-called open bit-line structure is used between the TCAM cell arrays. Furthermore, since a search-line driver has a structure to generate complementary signals to search line pairs in patent document 1, it is impossible to carry out the search operation in which a mask is applied to optional bits of a search key and the corresponding bits are forcibly regarded as the matched bits. Consequently, it is desirable that the search-line driver is also replaced with a new structure.

The second problem lies in that the search time of search operation is constrained by the charging time of a match line. In order to explain this problem, a memory array structure shown in non-patent document 1 and reference document 1 is shown. FIG. 2 is a circuit block diagram showing the memory array structure of a CAM studied as a premise of the present invention. FIG. 3 is a circuit diagram showing a detailed structure of each circuit block in FIG. 2.

In the memory array shown in FIG. 2, match lines form a hierarchical structure consisting of main match lines MMLm (m=0, 1, . . . ) and sub-match lines SMLmj (m=0, 1, . . . ; j=0, 1, . . . ) Memory cells DMC are disposed at intersections between multiple word lines WLm (m=0, 1, . . . ) and multiple bit lines BLnx (n=0, 1, . . . , x=0, 1, 2, 3), respectively. Each of multiple word lines is driven by a word driver block WDB, and each of multiple bit lines is driven by a read-write-circuit block RWB.

Corresponding multiple search lines SLnx (n=0, 1, . . . ; x=0, 1, 2, 3) are disposed in parallel, respectively to the bit lines BLnx (n=0, 1, . . . ; x=0, 1, 2, 3). Each of multiple search lines is driven by a search driver block SDB. In addition, corresponding multiple main match lines MMLm (m=0, 1, . . . ) are disposed in parallel, respectively to the word lines WLm (m=0, 1, . . . ).

Furthermore, multiple sub-match lines SMLmj (m=0, 1, . . . ; j=0, 1, . . . ) are disposed in parallel to the corresponding main match lines MMLm (m=0, 1, . . . ), respectively, and connected thereto via corresponding sub-match detectors SMDmj (m=0, 1, . . . ; j=0, 1, . . . ). For example, like the sub-match line SML00, four memory cells DMCi (i=0, 1, 2, 3) are connected to the sub-match lines, respectively. Groups consisting of these four memory cells DMCi (i=0, 1, 2, 3) are called memory blocks MBmj (m=0, 1, . . . ; j=0, 1, . . . ) in reference document 1 and non-patent document 1.

Each of the memory cells DMC is composed of three NMOS transistors T311, T312, and T313 and a capacitor C as shown in FIG. 3. In addition, a sub-match detector SMD is composed of a NMOS transistor T321 for pre-charging the corresponding sub-match line SML and a NMOS transistor T322 for discriminating minute signals generated in the sub-match line SML.

Furthermore, the main match detector block MMDB in FIG. 2 is composed of multiple main match detectors MMDm (m=0, 1, . . . ) as shown in FIG. 3. Also, each of the main match detector is composed of a PMOS transistor T331 for driving the corresponding main match line MML and a sense amplifier SA for discriminating comparison results in the entries on the corresponding main match line, and it outputs a hit signal (HIT0 in this case) of the voltage in accordance with the comparison results.

For example, when search operation is carried out in the structure as described above, first, the data (N00) stored in the memory cell DMC0 of FIG. 3 is compared with the data inputted to the search line SL00, and in accordance with the matched condition/unmatched condition thereof, charge holding or charge discharge of the pre-charged sub-match line SML00 is decided. In addition, as a result, ON/OFF of the NMOS transistor T322 in the sub-match detector SMD00 is also decided.

At this time, in order to read the information of the sub-match line SML00 by the main match detector MMD00, the main match line MML00 held to the ground voltage VSS in advance is gradually charged by the PMOS transistor T331, and the operation to examine the presence or absence of discharge by the NMOS transistor T322 is carried out. In such operations, since the current value to be charged is set to a value smaller than the ON current of the NMOS transistor T322, the main match line MML00 under the unmatched condition (when the NMOS transistor T322 is turned ON) is held to a voltage lower than the logic threshold value of the sense amplifier SA.

However, in the method in which the main match line MML00 is gradually charged, there is a possibility that start timing of a sense amplifier is delayed. More specifically, since the drive capability of a NMOS transistor is higher than that of a PMOS transistor in general, when the main match line charged to a high voltage is driven by the NMOS transistor in the match detector, signals in accordance with matched condition/unmatched condition can be generated more quickly, and the start timing of the sense amplifier can be made earlier.

Therefore, in consideration of the problems as described above, an object of the present invention is to achieve the speed-up or the reduction in power consumption of a semiconductor device including a CAM.

Note that the reference document 2 describes an interface circuit method in a CAM using the one-hot-spot block code described in reference document 1 and non-patent document 1. More specifically, a format of I/O signals as well as encoder and decoder circuit structure for compressing and storing multiple pieces of information in accordance with a data field and storing the information after providing a mask are described. In the CAM according to this document, when an IP address or the like is inputted and outputted, combinations of the minimum value and the difference are employed. The I/O signals of this kind of format are called quaternary data.

When other information is inputted and outputted, combinations of data and mask are employed. The I/O signals of this kind of format are called ternary data. By the use of the technology of this document, the external CAM controller can easily monitor the storage condition of the entry, and the convenience of the CAM using the one-hot-spot block code is increased.

The above and other objects and novel characteristics of the present invention will be apparent from the description of this specification and the accompanying drawings.

The typical ones of the inventions disclosed in this application will be briefly described as follows.

The semiconductor device according to the present invention comprises multiple banks, and each of the banks has multiple CAM arrays. Here, a sense amplifier, a read circuit, a write circuit, and a search line driver are disposed between multiple CAM arrays in each bank in a shared manner. Note that, as the connecting relation between bit lines and sense amplifiers in multiple CAM arrays, a so-called open bit line structure in which each one bit line from both CAM arrays is connected to the sense amplifier is used. In addition, memory cells in CAM arrays may be, for example, dynamic type memory cells.

In this structure, operations such as read, write, and refresh to memory cells can be correctly carried out. Furthermore, by performing the search operation in the interleave mode using multiple banks, high-speed search operation can be carried out.

In this case, it is preferable to distribute control clocks with different phases to multiple banks and carry out the processing of entries and search keys (read operation, write operation, and search operation) at different phases. Furthermore, by registering the same look-up table to multiple banks and sequentially inputting the successively inputted search keys into multiple banks, search operation can be performed in synchronization with control clocks of different phases.

In addition, the semiconductor device according to the present invention has a dummy circuit which generates a determination timing of the search results in the search operation by the CAM arrays. This dummy circuit is provided with, for example, a dummy memory cell, a dummy word line, a dummy match line, and others, which have the same structure as those of a memory cell, a word line, a match line, and others in the normal CAM arrays, and at the time of search operation, it always performs the operation fixed to matched condition or unmatched condition. Also, the dummy circuit monitors a voltage level of the dummy match line which varies in accordance with either of matched or unmatched condition, and activates a determination circuit (sense amplifier) of the match line in the normal CAM array at the optimum timing. By this timing optimization, the speed-up and reduction in power consumption can be achieved.

Furthermore, when determination of the match line and the dummy match line is to be carried out, it is preferable to adopt a method to detect whether the voltage of the rapidly charged match line lowers in accordance with the presence or absence of the discharge path, instead of the method to detect whether the voltage rises in accordance with the presence or absence of the discharge path while gradually charging the match line as described above. By doing so, the speed-up of search operation can be achieved. In addition, the voltage level of the match line is preferably kept at a voltage level of the unmatched condition in a default state. By doing so, it becomes possible to reduce power consumption in actual use.

The effects obtained by typical aspects of the present invention will be briefly described below. It is possible to achieve the speed-up and the reduction in consumption power of a semiconductor device.

BRIEF DESCRIPTIONS OF THE DRAWINGS

DESCRIPTIONS OF THE PREFERRED EMBODIMENTS

Figure 1:
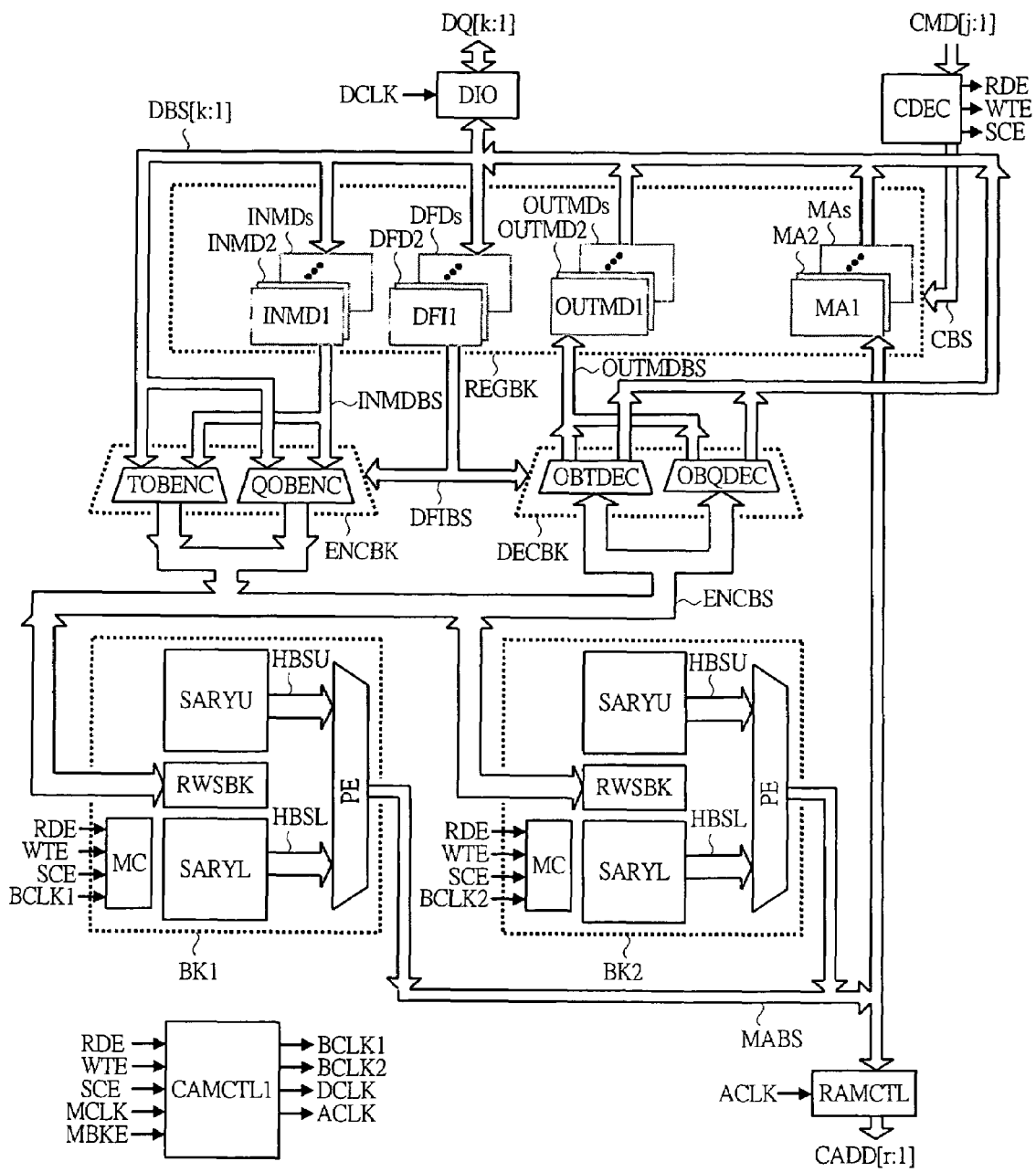
FIG. 1 is a block diagram showing an example of a basic structure of principal blocks of a CAM included in a semiconductor device according to the first embodiment of the present invention.

Hereinafter, embodiments of the present invention will be described in detail with reference to the accompanying drawings. Note that components having the same function are denoted by the same reference symbols throughout the drawings for describing the embodiment, and the repetitive description thereof will be omitted. In addition, circuit components which constitute each function block in the embodiments are not particularly limited, but are formed on a semiconductor substrate such as single crystal silicon by an integrated circuit technology such as a publicly known CMOS (complimentary MOS transistor), and others.

Note that, in the following embodiments, a MOS (Metal Oxide Semiconductor) transistor is used as an example of a MISFET (Metal Insulator Semiconductor Field Effect Transistor). In the drawings, by giving an arrow symbol to the gate of a P channel MOS transistor (PMOS transistor), it is discriminated from a N channel MOS transistor (NMOS transistor). The connection of substrate potential of a MOS transistor is not particularly stated in the drawings. However, the connection method is not particularly restricted as long as the MOS transistor can be normally operated.

First Embodiment

First, the entire structure of a CAM will be described.

FIG. 1 is a block diagram showing an example of a basic structure of principal blocks of a CAM included in the semiconductor device according to the first embodiment of the present invention. This structure includes a command decoder CDEC, a CAM control circuit CAMCTL1, a data I/O circuit DIO, various register blocks REGBK, an encoder block ENCBK, a decoder block DECBK, banked memory arrays BK1 and BK2, and a RAM control circuit RAMCTL. In FIG. 1, attention is placed on the path in which the data in search operation is transmitted and received, and a refresh counter, a low decoder, and others which are address-related circuit blocks are omitted for simplicity.

The command decoder CDEC receives and encodes command signals CMD [j:1] and outputs signals for selecting a register described later to various register blocks REGBK via a command bus CBS. Alternatively, it outputs a read enable signal RDE, a write enable signal WTE, and a search enable signal SCE to a control circuit block in the chip such as the CAM control circuit CAMCTL1 described later.

The CAM control circuit CAMCTL1 receives a master clock MCLK and a multi bank enable signal MBKE generated by a controller (or a control circuit called network processor or search engine, etc.) connected to the CAM according to the present invention, and at the same time, it generates bank control clocks BCLK1 and BCLK2, a data clock DCLK, and a content address clock ACLK in accordance with the above-mentioned read enable signal RDE, the write enable signal WTE, and the search enable signal SCE.

The data I/O circuit DIO is disposed between a data bus DQ [k:1] and an internal data bus DBS [k:1] and transfers address signals and data, and further, control signals which define various settings of chips. In the data transfer in particular, data is transferred in synchronization with the above-mentioned data clock DCLK. Note that, assuming that the bus width k is an even number, the description will be continued below.

The various register blocks REGBK include registers of multiple bits that correspond to the number of signal lines (k lines in this case) of the data bus DQ. In FIG. 1, as registers which transfer signals via the internal data bus DBS, four register blocks are shown.

First input mask/difference register blocks INMD1 to INMDs store mask information and differences in accordance with the data field of the entry and search key to be inputted. Second output mask/difference register blocks OUTMD1 to OUTMDs store mask information and difference in accordance with the data field of the entry to be read.

Third data field identification register blocks DFI1 to DFIs store identification information that distinguishes the information type processed by the CAM for each bit. Fourth match address registers MA1 to MAs are inserted between match address MABS described later and the internal data bus DBS and store match address (detail will be described later) generated at the time of search operation. Note that it has a function to sequentially output the address signals from those corresponding to most significant entries (for example, a row in which a corresponding low address has the smallest number) in the event that there are a plurality of matched entries. Also, the register blocks described above are composed of a plurality of registers of the same structure, respectively, and a desired register is selected by the above-mentioned command signal block and address signals.

The encoder block ENCBK has a ternary data-one-hot-spot block encoder block TOBENC and a quaternary data-one-hot-spot block encoder block QOBENC of k bits, which correspond to the number of signal lines (k lines in this case) of the data bus DQ, and either one of the encoders is activated for each encoding block in accordance with the value of data-field identification register blocks DFI1 to DFIs inputted via the data field identification bus DFIBS.

For example, in the event that encoding is carried out for every 2 bits, the structure of the encoder block ENCBK is set for every 2 bits in accordance with whether the information that corresponds to the encoding block is a ternary value or a quaternary value. Then, after the information obtained from the input mask/difference register blocks INMD1 to INMDs via the input mask/difference bus INMDBS (difference and mask in this case) and the information inputted via the internal data bus DBS (minimum value and data in this case) are received, one-hot-spot block encoding of the entry or search key is performed, and the encoded entry or search key is outputted to encoded data bus ENCBS composed of 2k signal lines.

On the other hand, the decoder block DECBK has one-hot-spot block codes-ternary data decoder block OBTDEC and one-hot-spot block code-quaternary data decoder block OBQENC of multiple bits that correspond to the number of signal lines (k line in this case) of the data bus DQ, and either one of decoders is activated for each encoding block in accordance with the value of data field identification register blocks DFI1 to DFIs inputted via the data field identification bus DFIBS.

For example, in the event that encoding is carried out for every 2 bits, the structure of the decoder block DECBK is set for every 2 bits in accordance with whether the information that corresponds to the encoding block is a ternary value or a quaternary value. Then, the entry read via the encoded data bus ENCBS composed of 2k signal lines is decoded and the mask and the difference are temporarily stored in the output mask/difference register blocks OUTMD1 to OUTMDs via the output mask/difference bus OUTMDBS, and at the same time, the data and minimum value are outputted to the data I/O circuit DIO via the internal data bus DBS.

Note that the details of these various register blocks REGBK, encoder block ENCBK, and decoder block DECBK are described in reference document 2.

Banks BK1 and BK2 have sub-arrays SARYU and SARYL obtained by further dividing the banked memory array, a read-write-search circuit block RWSBK, a memory control circuit MC, and a priority encoder PE, respectively. The sub-arrays SARYU and SARYL have the structure obtained by eliminating the search driver block SDB and the read-write circuit block RWB from the structure shown in FIG. 2. For example, in the event that entry or search key is encoded for every 2 bits, k/2 memory blocks are connected to one word line so that the entry of k bits can be stored in accordance with the bus width of the data bus DQ. In addition, although the detail will be described later, the read-write-search circuit block RWSBK is shared by the sub-arrays SARYU and SARYL.

The memory control circuit MC receives the read enable signal RDE, write enable signal WTE, and search enable signal SCE, respectively, and when any of these signals is activated in accordance with the operation, it generates the multiple internal control signals (details will be described later) in synchronization with the bank control clocks BCLK1 and BCLK2.

The priority encoder PE receives output signals of the main match detector block MMDB (that is, hit signal HIT0 and others shown in FIG. 3) in the sub-arrays SARYU and SARYL in the banks BK1 and BK2 in the search operation via matching signal buses HBSU and HBSL, and it generates address (hereinafter, called match address) signals that correspond to an entry matched with the search key. This address signal is inputted to the RAM control circuit RAMCTL and the match address register blocks MA0 to MAs via the match address bus MABS.

The RAM control circuit RAMCTL outputs the match address from a content address signal block CADD [r:1] to a DRAM (dynamic random access memory) and a SRAM (static random access memory) in response to the content address clock ACLK. In this case, r is an integer determined in accordance with the memory array structure of the CAM according to the present embodiment.

Note that the constituent elements that form the CAM according to the present embodiment are not limited to the circuit blocks or signals shown in FIG. 1, but include various element blocks and signals. For example, a phase locked loop PLL and a delay locked loop DLL for adjusting clock phases, a test circuit, a controller for controlling the cascade-connected chips, a RAM clock for controlling an external content memory (for example, SRAM or DRAM), a RAM control signal blocks, and others are omitted in FIG. 1 for simplicity.

Next, the structure and operation of the memory array will be described.

Figure 4:
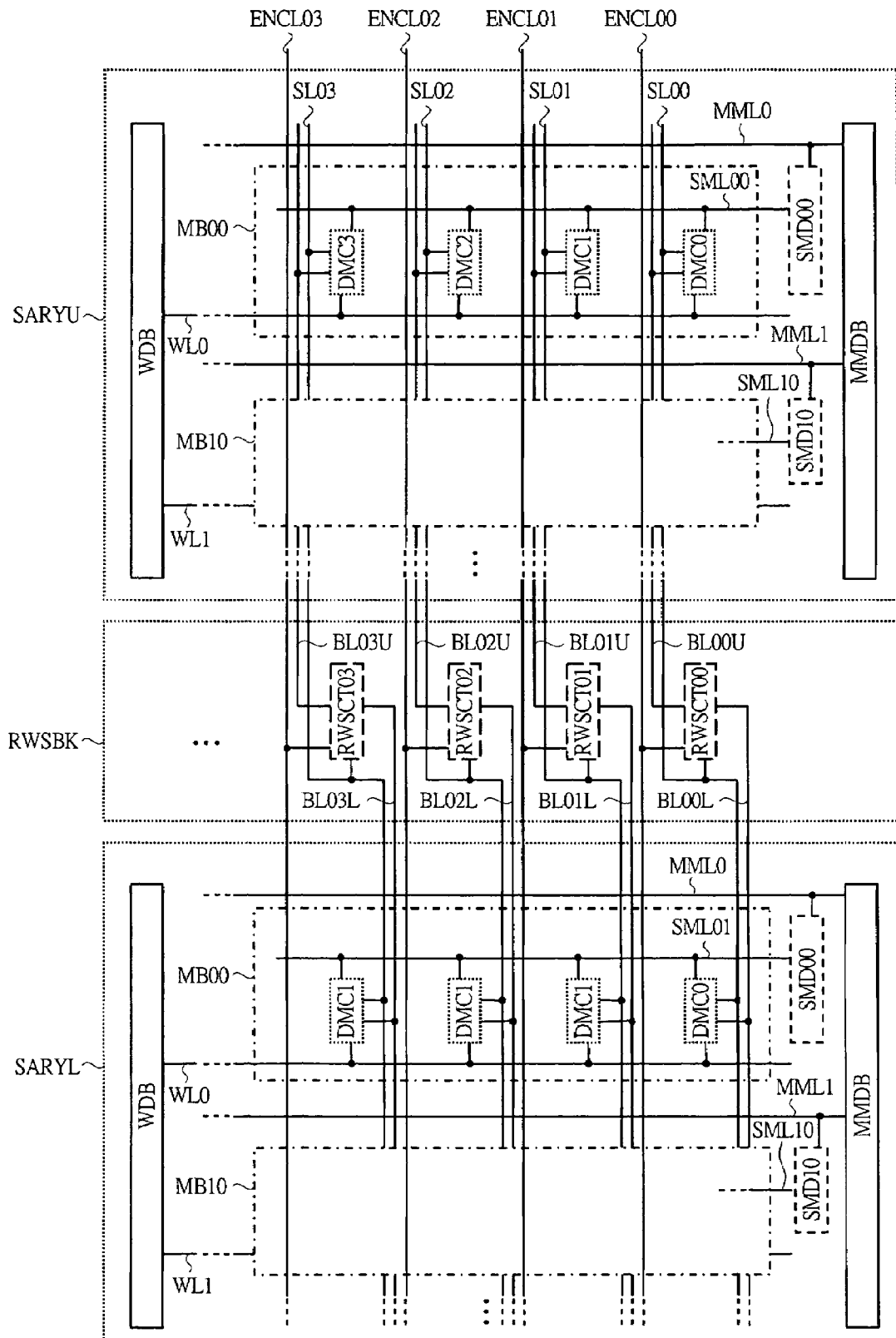
FIG. 4 is a circuit block diagram showing an example of a structure of the banks BK1 and BK2 in FIG. 1.

FIG. 4 is a circuit block diagram showing an example of the structure of the banks BK1 and BK2 in FIG. 1. The subscript 'n' of symbols shown below is any one of 0, 1, . . . , (k/2)−1 ('k' is an even number). Also, the subscript 'x' is any one of 0, 1, 2, and 3.

An encoded data line ENCLnx is a constituent element of the 2k encoded data buses ENCBS. The read-write-search circuit block RWSBK has 2k read-write-search circuits RWSCTnx. The encoded data bus ENCBS is connected to search lines SLnx via corresponding RWSCTnx, respectively. Each of the search lines SLnx is shared by the sub-arrays SARYU and SARYL and connected to the corresponding memory cells in both sub-arrays. Also, a bit line BLnxU in the sub-array SARYU and a bit line BLnxL in the sub-array SARYL which correspond to search lines SLnx are connected to corresponding read-write-search circuits RWSCTnx, respectively.

Figure 5:
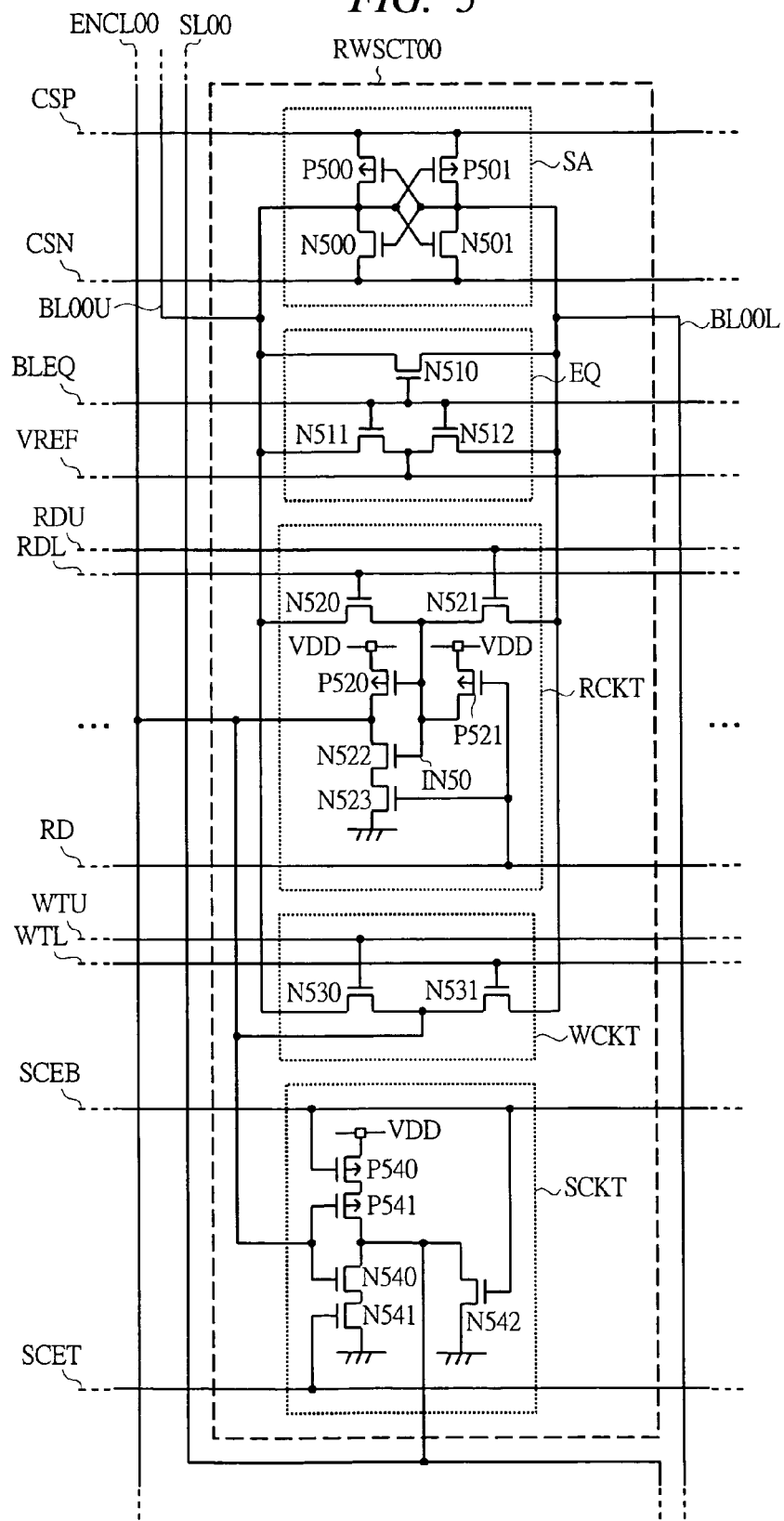
FIG. 5 is a circuit diagram showing an example of the structure of a read-write-search circuit with using the read-write-search circuit RWSCT00 in FIG. 4 as an example.

FIG. 5 is a circuit diagram showing an example of the structure of a read-write-search circuit with using the read-write-search circuit RWSCT00 in FIG. 4 as an example. The read-write-search circuit according to the present embodiment is composed of a sense amplifier SA, an equalize circuit EQ, a read circuit RCKT, a write circuit WCKT, and a search line driver SCKT.

The sense amplifier SA has a publicly known circuit structure, in which two PMOS transistors P500 and P501 and two NMOS transistors N500 and N501 are cross-coupled as widely used in a DRAM. In a standby time, a common source line CSP and a common source line CSN held to the reference voltage VREF (intermediate voltage between power supply voltage VDD and ground voltage VSS in this case) together with bit lines BL00U and BL00L are driven and activated to the power supply voltage VDD and the ground voltage VSS, respectively, and then, the minute voltage signals generated in the bit line pairs are amplified.

The equalize circuit EQ has a publicly known circuit structure composed of three NMOS transistors N510, N511, and N512 as widely used in a DRAM. In a standby time, by driving the bit line equalize signal BLEQ connected to relevant gates to a boost voltage VPP (in this case, boost voltage VPP is set to the voltage higher than the power supply voltage VDD by the threshold voltage VTN of a NMOS transistor or more), the transistors N511 and N512 are turned on so as to supply the reference voltage VREF to the bit line pair, and at the same time, the transistor N510 is turned on to short the bit line pair.

With the structure of the sense amplifier SA and the equalize circuit EQ described above, the read operation, write operation and re-store operation for refresh of the entry can be carried out in the same operation as a DRAM having the publicly known open bit line structure.

The read circuit RCKT is composed of PMOS transistors P520 and P521 and NMOS transistors N520, N521, N522, and N523. Either of the sources or the drains of the transistors N520 and N521 are connected to the bit lines BL00U and BL00L, respectively, and the others are connected to each other. This common node is denoted by IN50. Also, gate electrodes of the transistors N520 and N521 are connected to read start signals RDL and RDU, respectively. The transistors N522 and N523 are connected in series between the encoded data line ENCL00 and a terminal of the ground voltage VSS, and the transistor P520 is inserted between a terminal of the power supply voltage VDD and the encoded data line ENCL00 to form a current path.

In addition, the transistor P521 is inserted between a terminal of the power supply voltage VDD and the common node IN50 to form a current path. Furthermore, gate electrodes of the transistors P520 and N522 are connected to the common node IN50, and gate electrodes of the transistors P521 and N523 are connected to the read start signal RD, respectively. By the connections as described above, the transistors P520, N522, and N523 form a structure of a driver circuit which drives the encoded data line ENCL00. Note that these reading circuits (and writing circuit and searching line driver described later) have a circuit structure in which both paired bit lines BL00U/BL00L have the same load capacity.

In the circuit structure described above, in a standby time, all the read start signals RDL, RDU, and RD are held to the ground voltage VSS. Therefore, the transistors N520, N521, and N523 are in the cut-off state, and the bit line pair and the common node INS0 are separated. In addition, by turning on the transistor P521 to drive the common node IN50 to the power supply voltage VDD, the transistor P520 is brought into the cut-off state, and the driver circuit is brought into a high-impedance state.

On the other hand, when an entry on the sub-array SARYU side is to be read, after amplifying the minute signals read to the bit line pair by the sense amplifier SA, the read start signals RD and RDU which are held to the ground voltage VSS are driven to the boost voltage VPP while holding the read start signal RDL to the ground voltage VSS. By doing so, the transistor N521 is turned on and the bit line BL00L and the common node IN50 are short-circuited. In addition, by activating the driver circuit, the voltage signal with the polarity opposite to that of the bit line BL00L is outputted to the encoded data line ENCL00.

Conversely, when the entry on the sub-array SARYL side is to be read, the signals RD and RDL are driven to the boost voltage VPP. By doing so, the transistor N520 is turned on and the bit line BL00U and the common node IN50 are short-circuited. In addition, by activating the driver circuit, the voltage signal with the polarity opposite to that of bit line BL00U is outputted to the encoded data line ENCL00. By the structure and operation as described above, the balance of the load capacity of bit line pair in the read operation is maintained, and at the same time, the read signal with the same polarity as that of the entry can be read to the encoded data line with large load capacity at high speed.

The write circuit WCKT is composed of NMOS transistors N530 and N531. Either of sources or drains of the transistors N530 and N531 are connected to the bit lines BL00U and BL00L, respectively, and the others are connected to the encoded data line ENCL00. In addition, gates of the transistors N530 and N531 are connected to write start signals WTU and WTL, respectively.

In the event that the entry is to be written to the sub-array SARYU side in the circuit structure described above, after amplifying minute signals read to the bit line pair by the sense amplifier SA, the write start signal WTU which is held to the ground voltage VSS is driven to the boost voltage VPP while holding the write start signal WTL to the ground voltage VSS. By doing so, the transistor N530 is turned on and the bit line BL00U and the encoded data line ENCL00 are short-circuited.

Conversely, in the event that the entry is to be written to the sub-array SARYL side, the signal WTL is driven to the boost voltage VPP. By doing so, the transistor N531 is turned on and the bit line BL00L and the encoded data line ENCLO0 are connected. By the structure and operation as described above, the balance of load capacity of the bit line pair in the read operation is maintained, and at the same time, the same write operation as the DRAM of the open bit line structure can be carried out.

The search line driver SCKT is composed of PMOS transistors P540 and P541 and NMOS transistors N540, N541, and N542. The PMOS transistors P540 and P541 and the NMOS transistors N540 and N541 form a so-called clocked-inverter-type driver circuit structure. Gate electrodes of the transistors P540 and N541 are connected to the search start signals SCEB and SCET, respectively, and gate electrodes of the transistors P541 and N540 are connected to the encoded data line ENCL00 and the output node is connected to the search line SL00. The NMOS transistor N542 is inserted between the search line SL00 and a terminal of the ground voltage VSS so as to form a current path, and the gate electrode thereof is connected to the search start signal SCEB.

In the circuit structure as described above, since the search start signal SCEB is held to the power supply voltage VDD, the search line SL00 in the standby time is held to the ground voltage VSS when the transistor N542 is turned on. When the search operation begins, the search start signal SCET held to the ground voltage VSS is driven to the power supply voltage VDD and the search start signal SCEB held to the power supply voltage VDD is driven to the ground voltage VSS. By doing so, the transistor N542 is brought into the cut-off state, and at the same time, the driver circuit is activated. Then, by inputting the signals with a polarity opposite to that of the encoded search key into the encoded data line ENCL00 held to the power supply voltage VDD at the standby time, the search line SL00 is driven to the voltage that corresponds to the search key.

By the structure and operation as described above, the search line drive time in the search operation can be shortened, and the cycle of the memory array can be improved. In addition, since the encoded data bus is shared by the bit line and the search line, the number of bus wirings can be reduced and the chip area can be reduced.

Next, the search operation in the basic mode using the CAM of FIG. 1 will be described.

Figure 6:
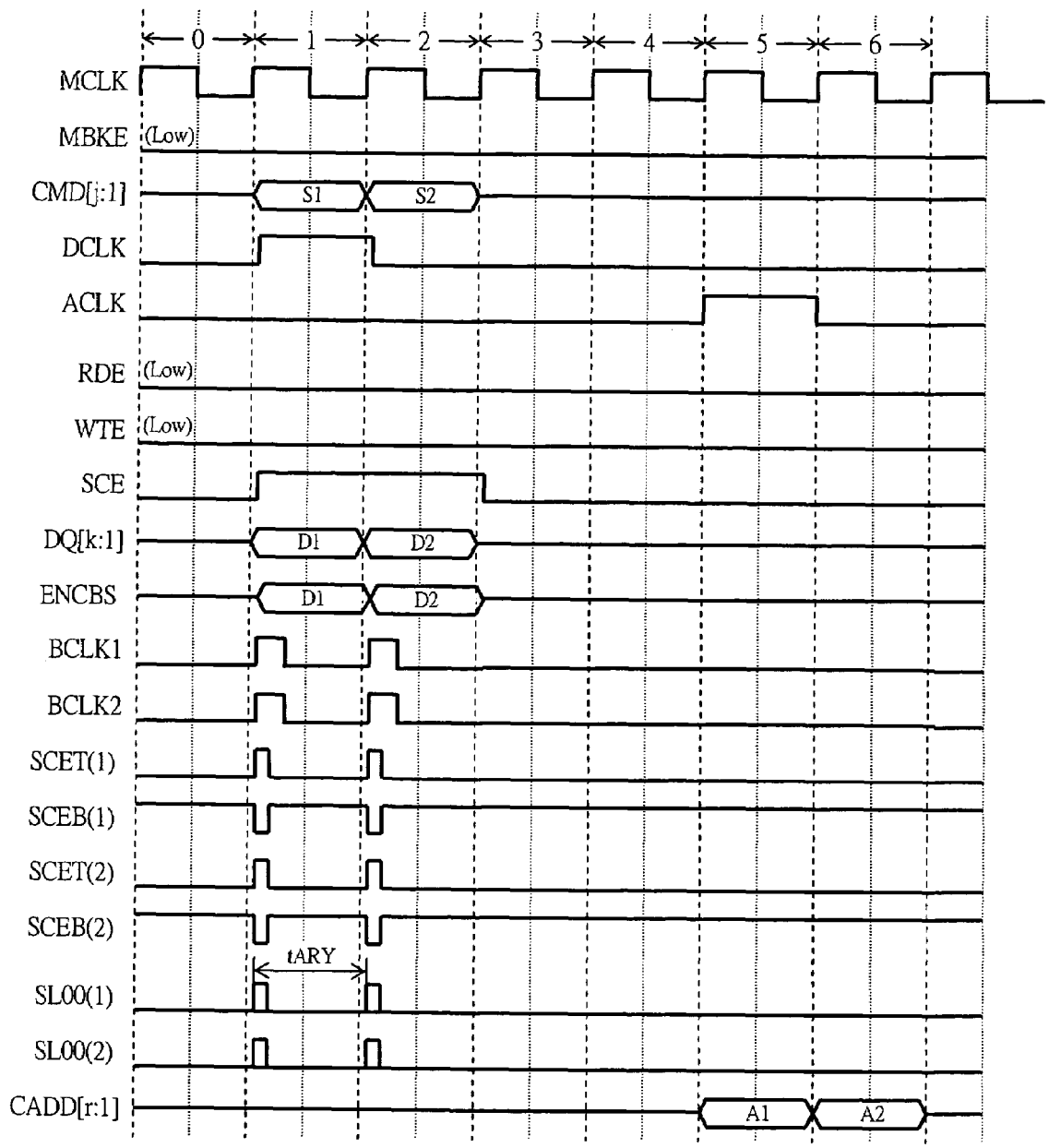
FIG. 6 is a waveform chart showing an example of the operation in which two search keys D1 and D2 are searched in a basic mode in the CAM of FIG. 1.

FIG. 6 is a waveform chart illustrating an example of the operation in which two search keys D1 and D2 are searched in the basic mode in the CAM of FIG. 1. The features of the present mode lie in that one look-up table is registered across the two banks BK1 and BK2 and the search operation is carried out.

First, in the first cycle, in synchronization with a master clock MCLK, a search command S1 is inputted via a command signal block CMD, and the search enable signal SCE is activated. In response to this, the CAM control circuit CAMCTL1 generates data clock DCLK obtained by dividing the frequency of the master clock MCKL, and in synchronization with the rising edge thereof, the search key D1 is inputted to the encoded data bus ENCBS via the data I/O circuit DIO and the encoder block ENCBK.

Simultaneously, the CAM control circuit CAMCTL1 generates pulse signals in the bank control clocks BCLK1 and BCLK2, respectively. In accordance with these bank control clocks and the search enable signal SCE, each of memory control circuits MC of the banks BK1 and BK2 activates search enable signals SCET(1), SCEB(1), SCET(2), and SCEB(2), respectively, so as to input the search key D1 into the memory array. That is, by the search line driver SCKT shown in FIG. 5, the search lines SL00(1) and SL00(2) are driven to the voltages that meet the corresponding bit of the search key D1, and the search operation is carried out in each of the banks. Note that figures in parentheses correspond to the subscripts of banks BK1 and BK2.

In the next second cycle, continuing from the first cycle, a search command S2 is inputted and the search enable signal SCE is held to the active state. In addition, in synchronization with the trailing edge of the data clock DCLK, the search key D2 is inputted to the encoded data bus ENCBS via the encoder block ENCBK. In addition, the CAM control circuit CAMCTL1 generates short pulse signals again in the bank control clocks BClK1 and BCLK2, respectively, in response to the search enable signal SCE. By doing so, the search key D2 is inputted into the banks BK1 and BK2, respectively. That is, the second search operation is carried out.

In this drawing, the banks BK1 and BK2 perform the search operation at a cycle time tARY, and the match addresses Al and A2 that correspond to this result are assumed to be outputted after 4 cycles counted from the input of the search keys D1 an D2. Consequently, in the fifth cycle, the address clock ACLK obtained by dividing the frequency of the master clock MCKL is generated in the CAM control circuit CAMCTL1, and the match address A1 is outputted from the RAM control circuit RAMCTL in synchronization with the rising edge thereof. Furthermore, in the sixth cycle, the match address A2 is outputted from the RAM control circuit RAMCTL in synchronization with the trailing edge of this address clock ACLK. By the operations as described above, a large-scale table search can be achieved by one CAM.

Next, search operation in the interleave mode using the CAM of FIG. 1 will be described.

Figure 7:
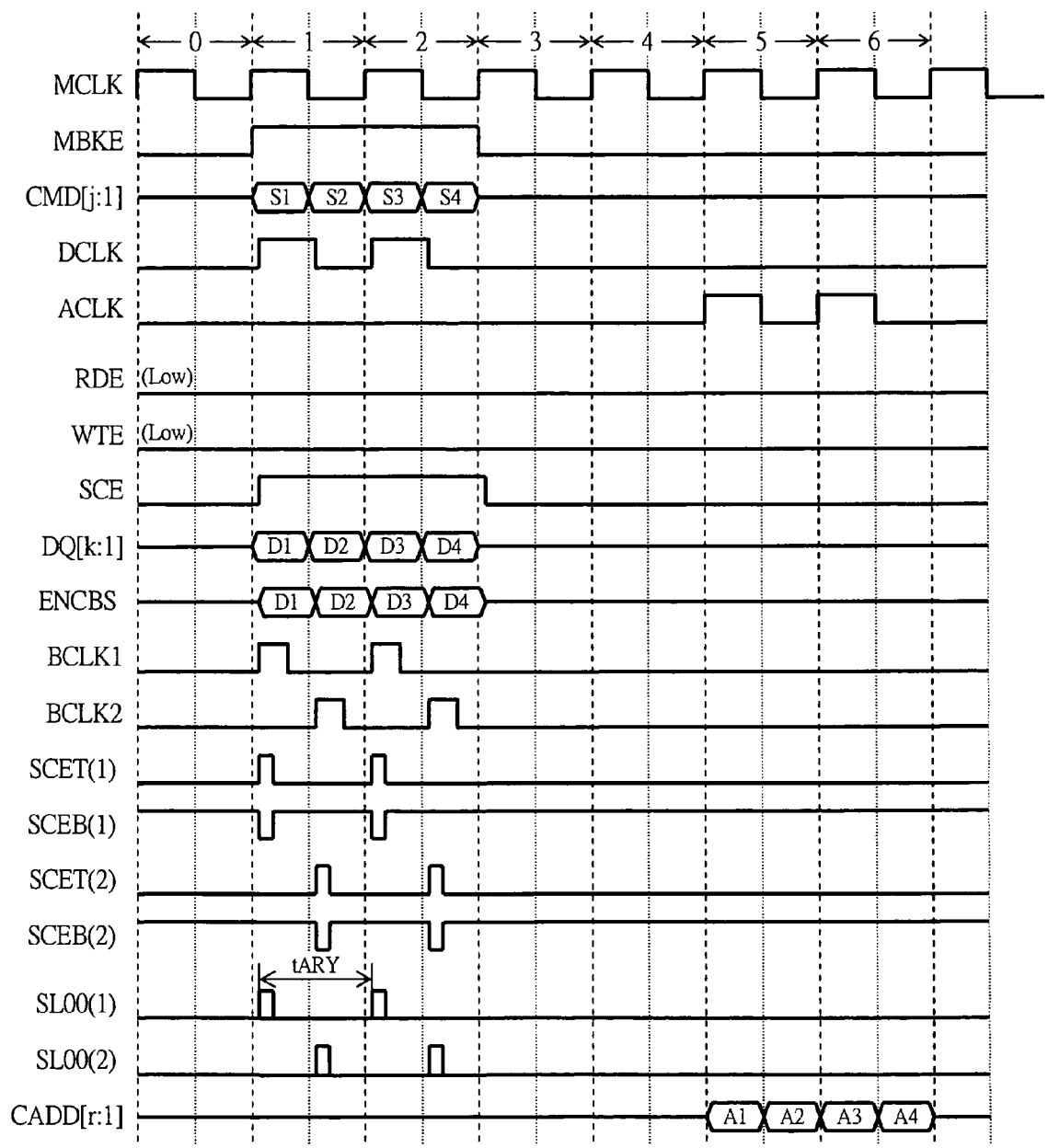
FIG. 7 is a waveform chart showing an example of the operation in which four search keys D1, D2, D3, and D4 are searched in an interleave mode in the CAM of FIG. 1.

FIG. 7 is a waveform chart showing an example of the operation in which four search keys D1, D2, D3, and D4 are searched in the interleave mode in the CAM of FIG. 1. The features of the present operation lie in that the same look-up table is registered to the banks BK1 and BK2 and different search keys are alternately inputted to carry out the search operation.

First, in the first cycle, the multi bank enable signal MBKE is started up and the search operation is set to the interleave mode. Simultaneously, in synchronization with the master clock MCLK, the search command S1 is inputted via the command signal block CMD, and the search enable signal SCE is activated. In response to these signals, the CAM control circuit CAMCTL1 generates data clock DCLK obtained by dividing the frequency of the master clock MCKL. In synchronization with the rising edge thereof, the search key D1 is inputted to the encoded data bus ENCBS via the data I/O circuit DIO and the encoder block ENCBK.

The CAM control circuit CAMCTL1 further generates the bank control clock BCLK1. In response to this bank control clock and search enable signal SCE, the memory control circuit MC of the bank BK1 activates the search enable signals SCET (1) and SCEB (1), respectively so as to input the search key D1 to the memory array. That is, by the search line driver SCKT shown in FIG. 5, the search line SL00 (1) is driven to the voltage that meets the corresponding bit of the search key D1 and the search operation is carried out in the bank BK1.

Next, the search command S2 is inputted in synchronization with the trailing edge of the master clock MCLK, and the search key D2 is inputted to the encoded data bus ENCBS in synchronization with the trailing edge of the data clock DCLK via the data I/O circuit DIO and the encoder block ENCBK. In addition, in the CAM control circuit CAMCTL1, pulse signals that correspond to the search enable signal SCE are generated in the bank control clock BCLK2, and the search key D2 is inputted into the bank BK2 by activating the search enable signals SCET (2) and SCEB (2) in response to the search enable signal SCE in the memory control circuit MC in the bank BK2. That is, by the search line driver SCKT shown in FIG. 5, the search line SL00 (2) is driven to the voltage that meets the corresponding bit of the search key D2 and the search operation is carried out in the bank BK2.

In the following second cycle, similar to the first cycle, the search keys D3 and D4 are alternately inputted to the banks BK1 and BK2 and the search operation is carried out. In this drawing, similar to FIG. 6, it is assumed that the match address is outputted after 4 cycles counted from the input of the search key. Consequently, from the fifth and following cycles, match addresses A1, A2, A3, and A4 are outputted from the RAM control circuit RAMCTL in synchronization with the rising edge and the trailing edge of the address clock ACLK generated in the same cycle as the master clock MCLK by the CAM control circuit CAMCTL1.

According to the above-mentioned operation, with using the banks BK1 and BK2 having the search operation cycle time of tARY, the CAM which receives the search key and performs the search processing at the speed twice as high as that of the operation of FIG. 6 can be achieved. However, in order to achieve this operation, the same look-up table is registered to the two banks. Therefore, the memory capacity is reduced by half. However, as shown in the above-mentioned non-patent document 1, in the CAM obtained from the combination of the one-hot-spot block encoding method which can store the compressed entry and the memory cell based on the general-purpose DRAM cells with excellent high integration capability, the memory capacity can be doubled in comparison with the conventional ternary CAM. Therefore, there is less possibility of the memory shortage.

In addition, in the search operation in the interleave mode, the problem of the increase in power consumption occurs because two banks are activated at the same time. However, when the one-hot-spot block encoding method is used, the compressed entry can be stored. Therefore, the memory area to be activated in one bank can be made narrower than that of the conventional ternary CAM, and the power consumption can be reduced. Consequently, the present invention is particularly suitable when it is applied to the CAM using a memory array of the one-hot-spot block encoding method. Accordingly, from the viewpoint of the capacity increase and power consumption reduction, it becomes possible to achieve a high-speed CAM which meets the trend of improvement of the line speed in the network by performing the search operation in the interleave mode using multiple banks.

Note that, the search operation has been described in the foregoing. However, it can be easily understood that, also in the read operation and the write operation, the read enable signal RDE and the write enable signal WTE are generated by inputting the read command and the write command from the command signal block CMD, and furthermore, banks BK1 and BK2 are activated by generating the bank control clocks BCLK1 and BCLK2 from the CAM control circuit CAMCTL1. In addition, it can be easily understood that, by the interleave mode, refresh operation can be carried out in the other bank while performing the search operation in one bank. In such an event, it is also possible to alleviate the penalty of the reduction of the search speed caused by the refresh operation.

Representative effects achieved by the use of the CAM of the first embodiment will be described as follows.

First of all, the first effect from the structure of the CAM of FIG. 1, FIG. 4, and FIG. 5 lies in that the entry can be correctly read and written and re-stored for refresh by adopting a sensing method of the so-called open bit-line structure in the same bank. The second effect lies in that the number of wirings of encoded data bus can be reduced by connecting the bit line and the search line to the common encoded data line via the read-write-search circuit and the chip area can be reduced.

The third effect lies in that the search operation mode can be changed in accordance with the applications by using the multi bank enable signal MBKE and two banks as is the case of the operations of FIG. 6 and FIG. 7. That is, in the basic mode, a large-capacity CAM can be achieved by registering a large-scale look-up table across two banks. On the other hand, in the interleave mode, it becomes possible to achieve a high-speed CAM which can receive and search the search keys in the cycle time shorter than the search operation cycle time of the bank by registering the same entry and alternately inputting different search keys to the two banks. In addition, it is also possible to carry out the refresh operation in the other bank while performing the search operation in one bank.

Note that it can be easily understood that the number of banks is not limited to two and various kinds of operations can be carried out by synchronizing a larger number of banks with the clocks of different phases, respectively. In such an event, it becomes possible to achieve a high-speed CAM which receives search keys at still higher frequency to perform the search processing.

Second Embodiment

In the second embodiment, another example of the structure and the operation of the CAM described in the first embodiment will be described.

Figure 8:
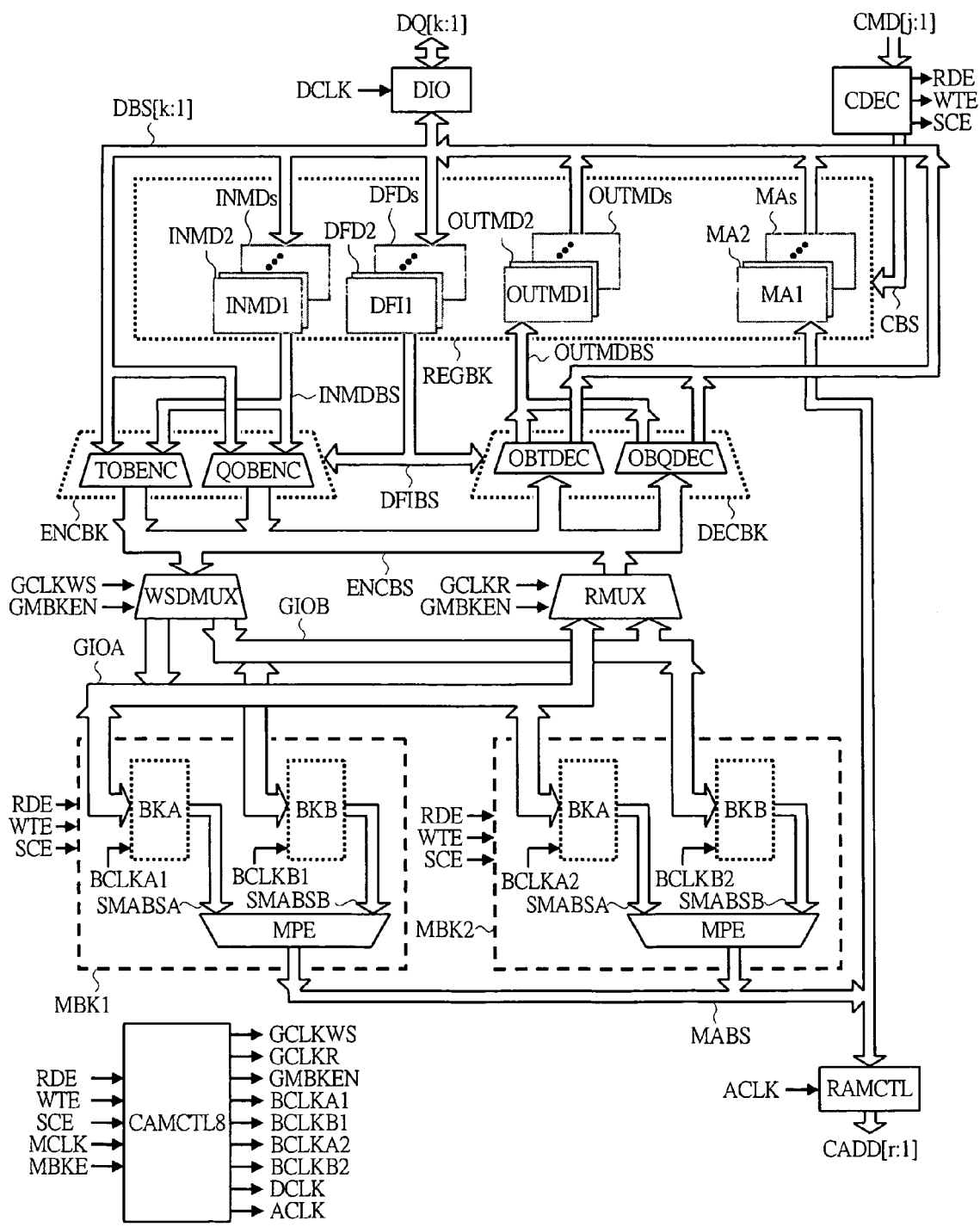
FIG. 8 is a block diagram showing an example of a basic structure of principal blocks of a CAM included in a semiconductor device according to the second embodiment of the present invention.

FIG. 8 is a block diagram showing an example of the basic structure of principal blocks of the CAM included in a semiconductor device according to the second embodiment of the present invention. The features of this structure lie in that banked memory arrays form a hierarchical structure, and the search operation of search keys wider than the bus width of the data bus DQ is performed by using a memory array structure which has two main banks composed of multiple banks. In the following description, the structure of FIG. 8 will be described while focusing on the points different from the structure shown in FIG. 1.

A CAM control circuit CAMCTL8 receives a master clock MCLK and a multi bank enable signal MBKE generated by a controller (or a control circuit called network processor or search engine, etc.) connected to the CAM according to the present invention, and at the same time, it generates bank control clocks BCLKA1, BCLKB1, BCLKA2, and BCLKB2, a data clock DCLK, and a content address clock ACLK in response to a read enable signal RDE, a write enable signal WTE, and a search enable signal SCE. In addition, it also generates global IO control clocks GCLKWS and GCLKR and a multi bank enable signal GMBKEN.

A demultiplexer WSDMUX receives an entry and a search key encoded by the encoder block ENCBK via the encoded data bus ENCBS, properly distributes them to two global IOs (GIOA and GIOB) in response to a global IO control clock GCLKWS and a multi bank enable signal GMBKEN, and then transfers them to a main bank described later. Conversely, a multiplexer RMUX properly receives entries read from the main bank from the two global IOs (GIOA and GIOB) in response to the global IO control clock GCLKR and the multi bank enable signal GMBKEN, and outputs them to the decoder block DECBK via the encoded data bus ENCBS.

Each of the main banks MBK1 and MBK2 is composed of banks BKA and BKB and a main priority encoder MPE. The banks BKA and BKB have the same structure as that of the banks BK1 and BK2 shown in FIG. 1. The bank BKA in the main bank MBK1 transfers information with the global IO (GIOA) in synchronization with the bank control signal BCLKA1. The bank BKB in the main bank MBK1 transfers information with the global IO (GIOB) in synchronization with the bank control signal BCLKB1. The bank BKA in the main bank MBK2 transfers information with the global IO (GIOA) in synchronization with the bank control signal BCLKA2. The bank BKB in the main bank MBK2 transfers information with the global IO (GIOB) in synchronization with the bank control signal BCLKB2.

Also, the main banks MBK1 and MBK2 composed of these banks perform the operation in accordance with the read enable signal RDE, the write enable signal WTE, and the search enable signal SCE. The main priority encoder MPE generates a match address to a match address bus MABS in accordance with the outputs of the priority encoders PE in the banks BKA and BKB received via sub-match address buses SMABSA and SMABSB.

Next, the search operation in the basic mode using the CAM of FIG. 8 will be described.

Figure 9:
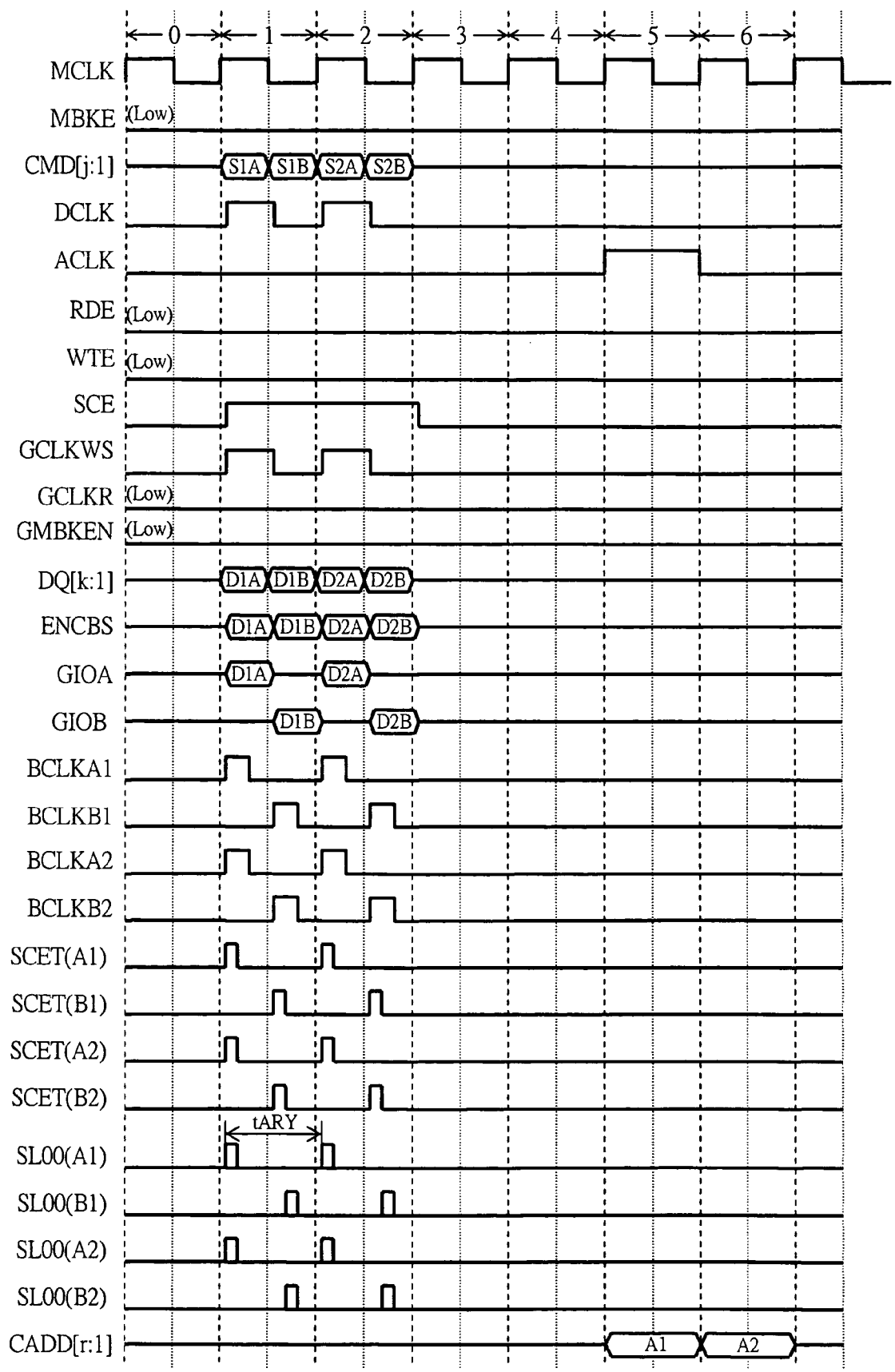
FIG. 9 is a waveform chart showing an example of the operation in which two search keys with a 2k-bit width which is wider than the bus width of a data bus DQ are searched in a basic mode in the CAM of FIG. 8.

FIG. 9 is a waveform chart showing an example of the operation in which two search keys with a 2k-bit width which is wider than the bus width of the data bus DQ are searched in the basic mode in the CAM of FIG. 8.

First, in the first cycle, a search command S1A is inputted via a command signal block CMD in synchronization with the master clock MCLK, and a search enable signal SCE is activated. At the same time, the first-half bit D1A of the first search key is inputted to the encoded data bus ENCBS in synchronization with the rising edge of the data clock DCLK with the same cycle as that of the master clock MCLK via the data I/O circuit DIO and the encoder block ENCBK.

In addition, when the multi bank enable signal GMBKEN is in an inactive state and a global IO control clock GCLKWS with the same cycle as that of the master clock MCLK rises, the search key is transferred from the demultiplexer WSDMUX to the global IO (GIOA). Furthermore, in the CAM control circuit CAMCTL8, the pulse signals in accordance with the search enable signal SCE are generated in the bank control clocks BCLKA1 and BCLKA2, respectively, and in the memory control circuit MC in the banks BKA in the main banks MBK1 and MBBK2, the search enable signals SCET (A1) and SCET (A2) are activated in accordance with the search enable signal SCE (for simplicity, search enable signals SCEB (A1) and SCEB (A2) are omitted). By doing so, the search key is inputted to the banks BKA in the main banks MBK1 and MBK2, respectively.

That is, by the search line driver SCKT shown in FIG. 5, the search lines SL00 (A1) and SL00 (A2) are driven to the voltages in accordance with the corresponding bits of the search key, and the search operation is performed simultaneously in the banks BKA in the main banks MBK1 and MBK2. Note that the alphabetical and numerical characters in the parentheses correspond to the subscripts of the main banks and the banks, and they indicate locations of the banks. For example, SCET (A1) means a search enable signal in the bank BKA in the main bank MBK1.

Then, the search command S1B is inputted in synchronization with the trailing edge of the master clock MCLK, and the latter-half bit D1B of the first search key is inputted to the encoded data bus ENCBS in synchronization with the trailing edge of the data clock DCLK via the data I/O circuit DIO and the encoder block ENCBK. In addition, when the multi bank enable signal GMBKEN is in an inactive state and a global IO control clock GCLKWS with the same cycle as that of the master clock MCLK falls, the search key is transferred from the demultiplexer WSDMUX to the global IO (GIOB).

Furthermore, in the CAM control circuit CAMCTL8, pulse signals in accordance with the search enable signal SCE are generated in the bank control clocks BCLKB1 ad BCLKB2, respectively, and in the memory control circuit MC in the banks BKB in the main banks MBK1 and MBK2, the search enable signals SCET (B1) and SCET (B2) are activated in accordance with the search enable signal SCE (for simplicity, search enable signals SCEB (B1) and SCEB (B2) are omitted). By doing so, the search key is inputted in the banks BKB in the main banks MBK1 and MBK2, respectively.

That is, by the search line driver SCKT shown in FIG. 5, the search lines SL00 (B1) and SL00 (B2) are driven to the voltages that meet the corresponding bits of the search key, and the search operation is performed in the banks BKB in the main banks MBK1 and MBK2.

In the following second cycle, similar to the first cycle, the second search key is inputted after being divided into a first-half bit D2A and a latter-half bit D2B, and the search operation is carried out in the main banks MBK1 and MBK2, respectively. In this drawing, similar to FIG. 6, it is assumed that the match address is outputted after 4 cycles counted from the input of the search key, and in the fifth and following cycles, the match addresses A1 and A2 are outputted from the RAM control circuit RAMCTL in synchronization with the rising edge and the trailing edge of the address clock ACLK obtained by doubling the frequency of the master clock MCLK. By the structure and the operation described above, the search operation of a search key with a wide bit width can be carried out in six cycles, similar to the operation shown in FIG. 6.

Then, the search operation in the interleave mode using the CAM of FIG. 8 will be described.

Figure 10:
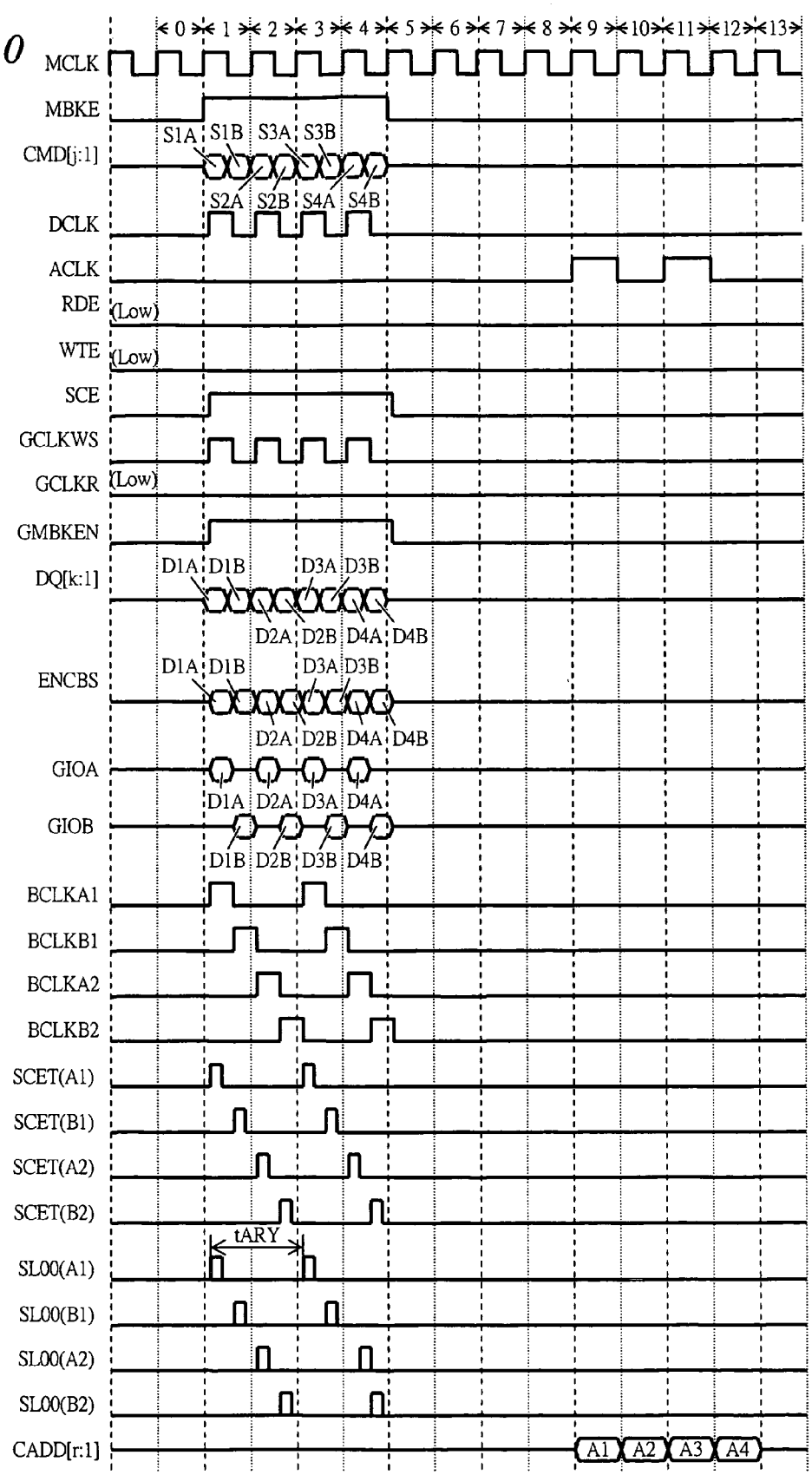
FIG. 10 is a waveform chart showing an example of the operation in which four search keys with a 2k-bit width are searched in the interleave mode in the CAM of FIG. 8.

FIG. 10 is a waveform chart showing an example of the operation in which four search keys with a 2k-bit width are searched in the interleave mode in the CAM of FIG. 8. The features of this operation lie in that the cycle time of the master clock MCLK is set to be shorter than the search operation cycle time tARY of the memory array (in this case, tARY/2) to receive the search keys at high speed, and the search processing is carried out.

First, in the first cycle, the multi bank enable signal MBKE is activated and the search operation is set to the interleave mode. Then, by using the CAM control circuit CAMCTL8, pulse signals with the same cycle as that of the master clock MCLK are generated in the data clock DCLK and the global IO control clock GCLKWS. Also, in accordance with the multi bank enable signal MBKE, the multi bank enable signal GMBKEN rises.

Furthermore, the search command S1A is inputted in synchronization with the master clock MCLK via the command signal block CMD, and the search enable signal SCE is activated. Simultaneously, the first-half bit D1A of the first search key is inputted to the encoded data bus ENCBS in synchronization with the rising edge of data clock DCLK via the data I/O circuit DIO and the encoder block ENCBK. Then, when the multi bank enable signal GMBKEN is in an active state and a global IO control clock GCLKWS rises, the search key is transferred from the encoder block ENCBK to the global IO (GIOA) via the demultiplexer WSDMUX.

Furthermore, in the CAM control circuit CAMCTL8, pulse signals in accordance with the search enable signal SCE and the multi bank enable signal MBKE are generated in the bank control clock BCLKA1, and the search enable signal SCET (A1) is activated in accordance with the search enable signal SCE in the memory control circuit MC in the bank BKA in the main bank MBK1 (for simplicity, search enable signal SCEB (A1) is omitted). By doing so, the search key is inputted to the bank BKA in the main bank MBK1. More specifically, by the search line driver SCKT shown in FIG. 5, the search line SL00 (A1) is driven to the voltage that meets the corresponding bit of the search key, and the search operation is carried out in the bank BKA in the main bank MBK1.

Then, the search command S1B is inputted in synchronization with the trailing edge of the master clock MCLK, and the latter-half bit D1B of the first search key is inputted to the encoded data bus ENCBS in synchronization with the trailing edge of the data clock DCLK via the data I/O circuit DIO and the encoder block ENCBK. Then, when the multi bank enable signal GMBKEN is in an active state and the global IO control clock GCLKWS with the same cycle as that of the master clock MCLK falls, the search key is transferred from the demultiplexer WSDMUX to the global IO (GIOB).

Furthermore, in the CAM control circuit CAMCTL8, the pulse signal in accordance with the search enable signal SCE is generated in the bank control clock BCLKB1, and furthermore, the search enable signal SCET (B1) is activated in accordance with the search enable signal SCE (for simplicity, search enable signal SCEB (B1) is omitted) in the memory control circuit MC in the bank BKB in the main bank MBK1. By doing so, the search key is inputted to the bank BKB in the main bank MBK1. More specifically, the search line SL00 (B1) is driven to the voltage that meets the corresponding bit of the search key, and the search operation is carried out in the bank BKB in the main bank MBK1.

In the following second cycle, similar to the first cycle, the second search key is inputted after being divided into a first-half bit D2A and a latter-half bit D2B, and the search operation is carried out in accordance with the successive rising of the bank control clocks BCLKA2 and BCLKB2 in the banks BKA and BKB in the main bank MBK2.

By performing the foregoing operations in the third cycle to the fourth cycle, the third and fourth search keys are searched respectively in the main banks MBK1 and MBK2. In this drawing, it is assumed that the time from the input of the search key to the output of the match address is same as that of FIG. 6. As described above, since the frequency of the master clock MCLK is twice as high as the search operation frequency of the bank, after 8 cycles which are equivalent to the operation time shown in FIG. 6, the match addresses A1, A2, A2, and A4 are outputted from the RAM control circuit RAMCTL respectively in synchronization with each edge of the address clock ACLK generated by dividing the frequency of the master clock MCLK in the CAM control circuit CAMCTL8.

By the structure and operation described above, it is possible to receive the search keys with a wide bit width and carry out the search operation in a cycle time shorter than the search operation cycle time tARY of the memory array. In addition, even when the load capacity is increased due to the wirings of the global IO provided throughout a wide range of a chip and it becomes difficult to shorten the operation cycle time of the global IO, the search key and the entry can be transferred to the bank at high speed by alternately using two global IO, and the search operation can be carried out.

Note that it can be easily understood that the number of banks is not limited to two and various kinds of operations can be carried out while synchronizing a larger number of banks with the clocks of different phases similar to the first embodiment. In such an event, it becomes possible to achieve a high-speed CAM which receives search keys at still higher frequency to perform the search processing. In addition, in FIG. 8, the structure in which the encoded data is distributed into the chip by using two global IOs has been shown. However, the number of global IOs is not limited to this. If the operation cycle time of the global IO is shorter than the cycle time required for the receive operation of the search key, only one global IO is enough, and the chip area can be reduced.

Third Embodiment

Figure 11:
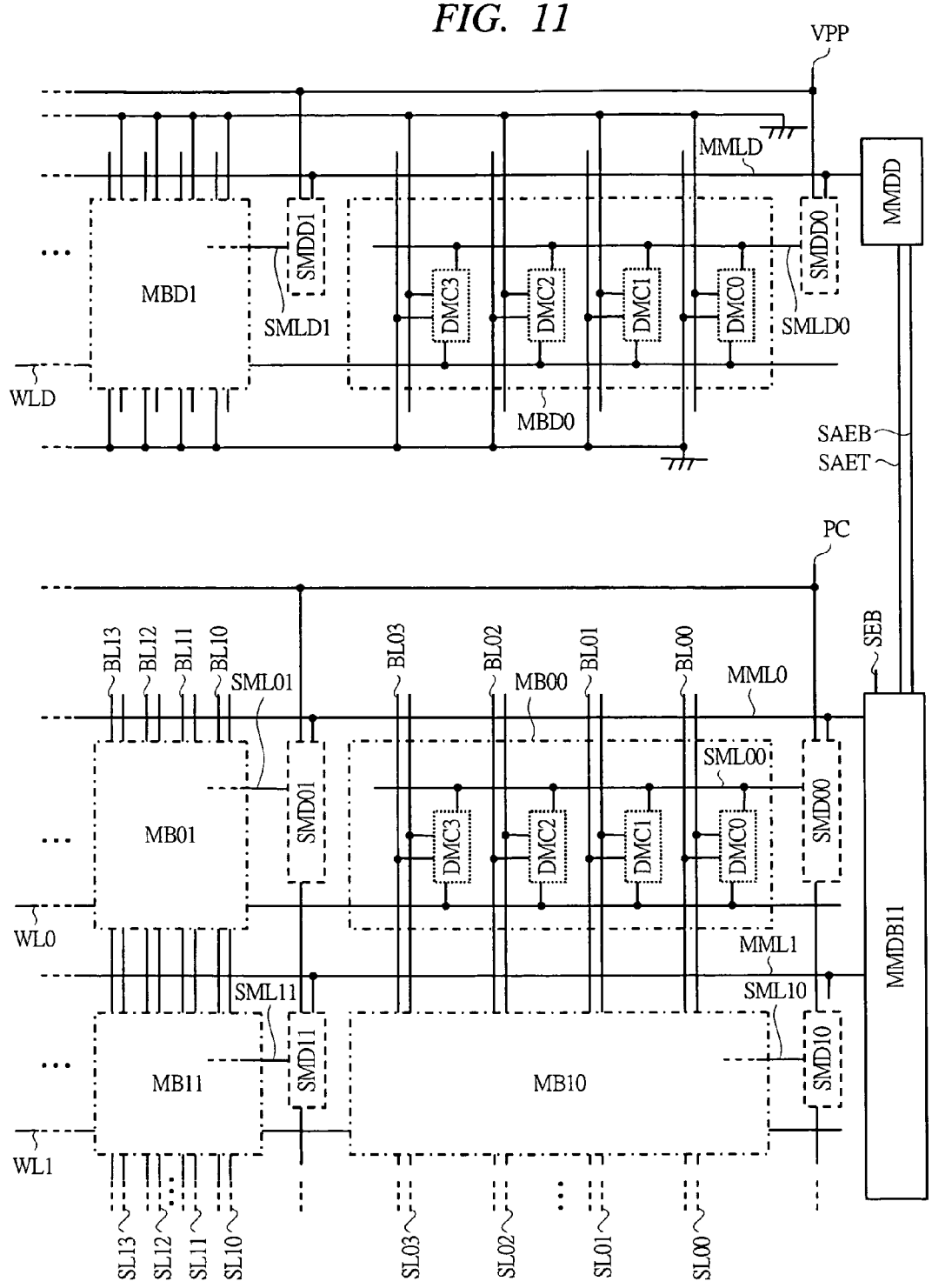
FIG. 11 is a circuit block diagram showing an example of a memory array structure which is different from that of FIG. 2 in the CAM included in a semiconductor device according to the third embodiment of the present invention.

In the third embodiment, another example of the structure and the operation of the sub-array used in the CAM described in the first and second embodiments will be described. FIG. 11 is a circuit block diagram showing an example of a memory array structure different from that of FIG. 2 in the CAM included in a semiconductor device according to the third embodiment of the present invention. In the following description, the structure of FIG. 11 will be described while focusing on the points different from the memory array structure shown in FIG. 2.

Figure 2:
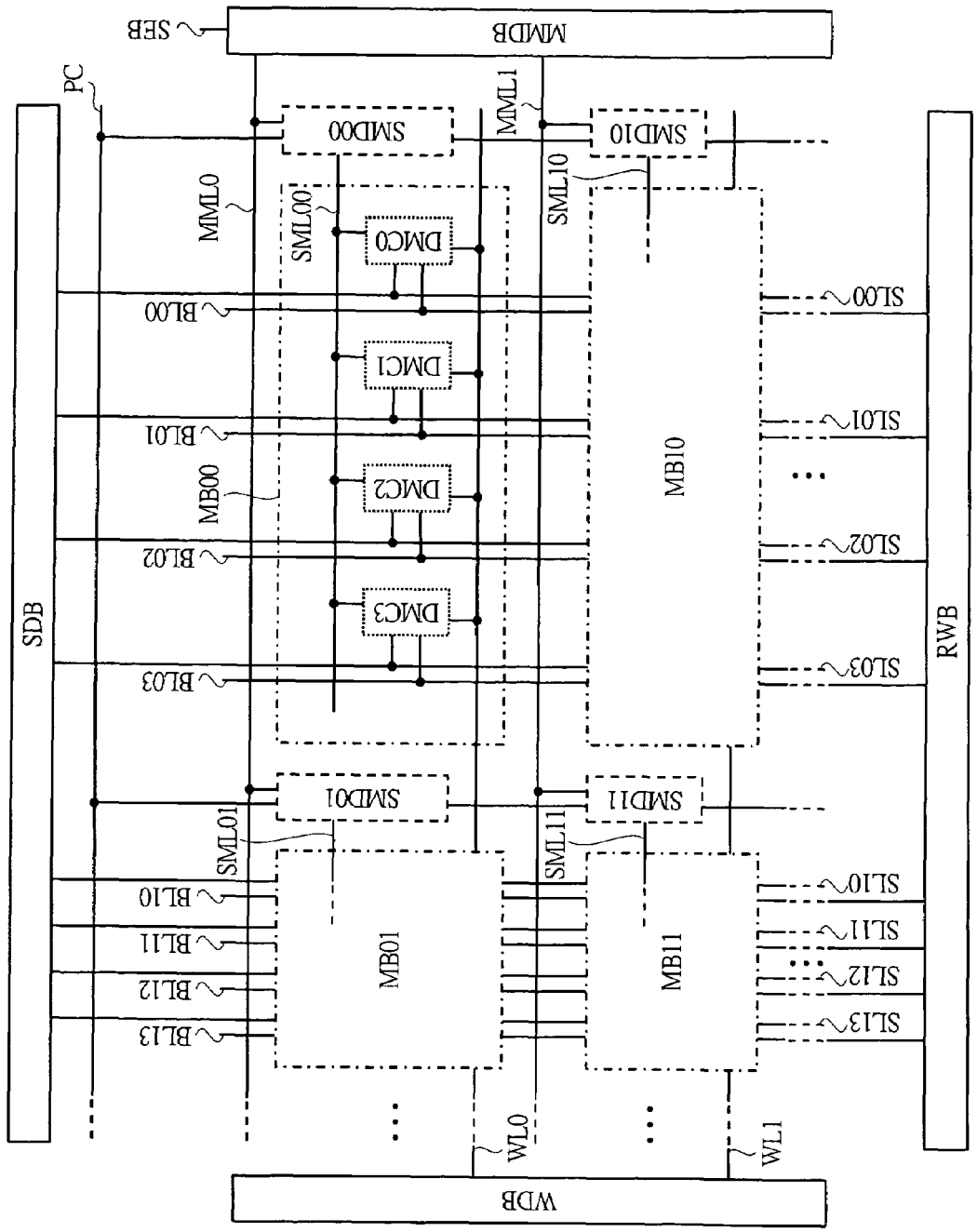
FIG. 2 is a circuit block diagram showing a memory array structure of a CAM studied as a premise of the present invention.
Figure 3:
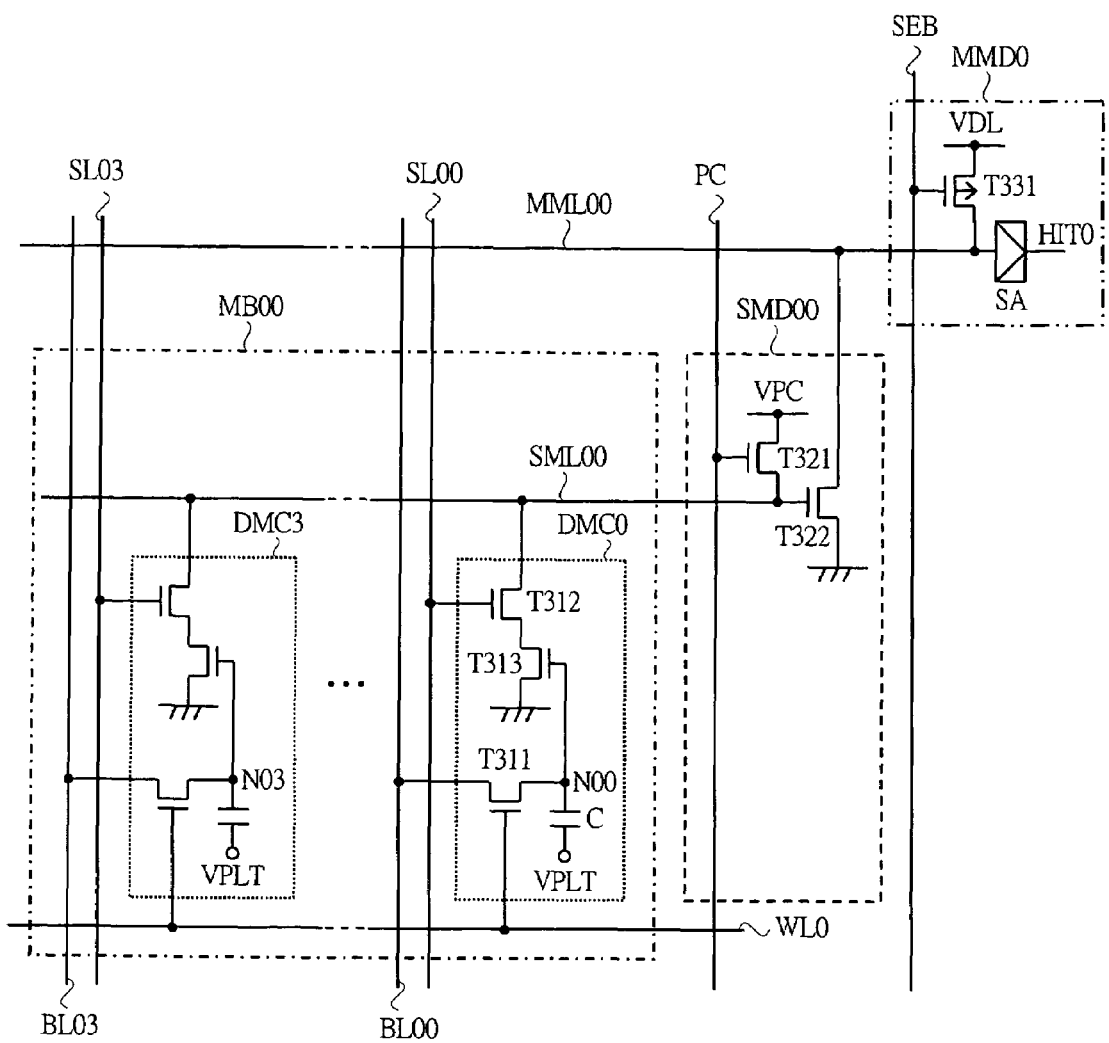
FIG. 3 is a circuit diagram showing a detailed structure of each circuit block in FIG. 2.

The features of the memory array structure shown in FIG. 11 lie in that, in addition to normal memory blocks shown in FIG. 2 and FIG. 3, dummy memory blocks MBD0, MBD1, . . . with the same structure are further disposed on a dummy word line WLD to generate the sense amplifier start timing. Between dummy sub-match lines SMLD0, SMLD1, . . . and a dummy main match line MMLD in the dummy memory blocks MBD0, MBD1, . . . , corresponding dummy sub-match detectors SMDD0, SMDD1, . . . are inserted, respectively.

In addition, each of memory cells DMC0, DMC1, DMC2, and DMC3 in the dummy memory blocks MBD0, MBD1, . . . is connected to a dummy word line WLD, and gate electrodes of transistors T312 and T313 in each memory cell are fixed to the ground voltage VSS. The dummy main match detector MMDD generates pulse signals in accordance with the voltage change of the dummy main match line MMLD to the sense amplifier enable signals SAEB and SAET. Then, the main match detector block MMDB11 that corresponds to the normal memory blocks MB00, MB01, . . . is controlled by the above-mentioned sense amplifier enable signals SAEB and SAET.

Figure 12:
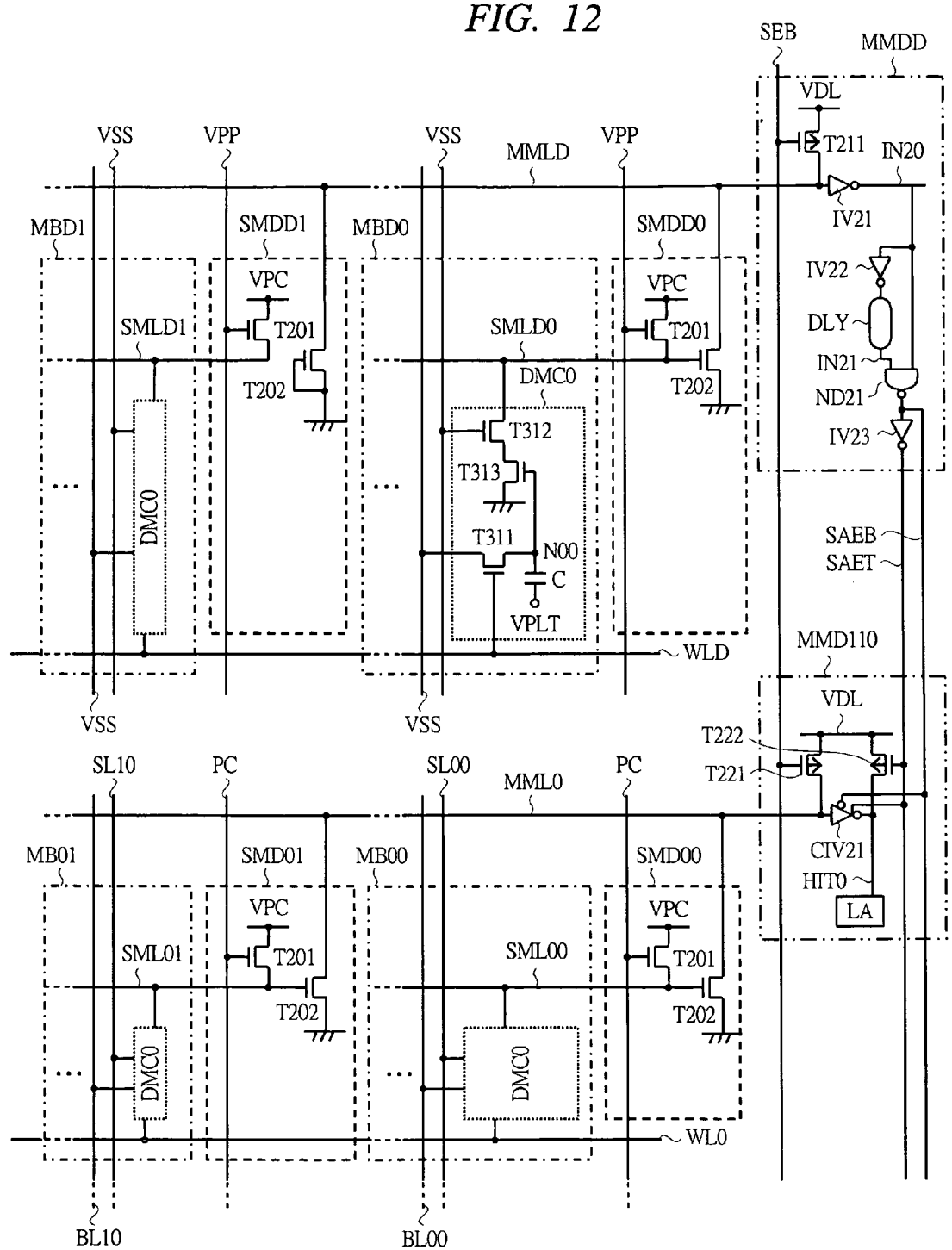
FIG. 12 is a circuit diagram showing an example of a structure of a dummy sub-match detector, a dummy main match detector, and a main match detector in FIG. 11 in detail.

FIG. 12 is a circuit diagram showing an example of the structure of the dummy sub-match detector, the dummy main match detector, and the main match detector of FIG. 11 in detail. In the dummy sub-match detectors SMDD0, SMDD1, . . . of FIG. 12, the same transistors as those of the sub-match detectors SMD00, SMD01, . . . are provided, and the gate electrode of the transistor T202 is separated from the dummy sub-match line and connected to the ground in the dummy sub-match detectors SMDD1, . . . other than the dummy sub-match detector SMDD0. Also, the transistor T201 is turned on because the gate electrode thereof is fixed to the boost voltage VPP, and the dummy sub-match lines SMLD0, SMLD1, . . . are constantly driven to the pre-charge voltage VPC.

In this case, the pre-charge voltage VPC is set to a voltage level which is lower than the array voltage VDL but is high enough to turn on the transistor T202. Consequently, the transistor T202 in the dummy sub-match detector SMDD0 turns on, and the transistors T202 in other dummy sub-match detectors are held in a cut-off state. That is, the entry in which only one memory block (in this case, dummy memory block MBD0) is held in the unmatched condition is assumed, and the corresponding signals are generated in the dummy main match line MMLD. Note that the array voltage VDL is set to the voltage lower than the power supply voltage VDD described in the first embodiment.

The dummy main match detector MMDD is composed of a PMOS transistor T211, inverter circuits IV21, IV22, and IV23, a NAND circuit ND21, and a delay circuit DLY. A gate size of the transistor T211 is designed so that it can have the driving capacity greater than that of the transistor T202 in the sub-match detector, and the dummy main match line MMLD is charged at high speed in accordance with the search enable single (search enable signal line) SEB connected to the gate electrode.

The inverter circuit IV21 outputs signals in accordance with the voltage change of the dummy main match line MMLD connected to the input terminal to the node IN20. The inverter circuits IV22 and IV23, the NAND circuit ND21 and the delay circuit DLY are connected so as to achieve a circuit structure that generates one shot pulse in accordance with the voltage change of the node IN20. The delay circuit DLY has a structure in which even number of inverter circuits are dependently connected, and the signals of the node IN20 are delayed after inverting them in the inverter circuit IV22 and then inputted to one of the input terminals of the NAND circuit ND21. The node IN20 is directly connected to the other input terminal of the NAND circuit ND21, and the sense amplifier enable signal SAEB is generated from the output terminal of the NAND circuit ND21. Also, the sense amplifier enable signal SAEB is inverted in the inverter circuit IV23 to generate the sense amplifier enable signal SAET.

The main match detector MMD110 is one of the multiple main match detectors which constitute the main match detector block MMDB11 in FIG. 11, and it is composed of PMOS transistors T221 and T222, a clocked inverter circuit CIV21, and a latch circuit LA. The gate of the transistor T221 is designed so as to have the same size as that of the transistor T211 in the dummy main match detector MMDD, and the main match line MML0 is charged at high speed in accordance with the search enable signal SEB connected to the gate electrode.

The clocked inverter circuit CIV21 corresponds to the sense amplifier SA shown in FIG. 3, and it is activated by the sense amplifier enable signals SAET and SAEB and outputs signals in accordance with the voltage of the main match line MML0 to the hit signal node HIT0. The transistor T222 has the source electrode and the drain electrode connected to an array voltage VDL terminal and a hit signal node HIT0, respectively. Also, the gate electrode thereof is connected to the sense amplifier enable signal SAET, and drives the hit signal node HIT0 to the array voltage VDL at the standby time. The voltage change of the hit signal node HIT0 is stored in the latch circuit LA.

In a memory array with the structure as described above, the search operation is carried out as follows.

Figure 13:
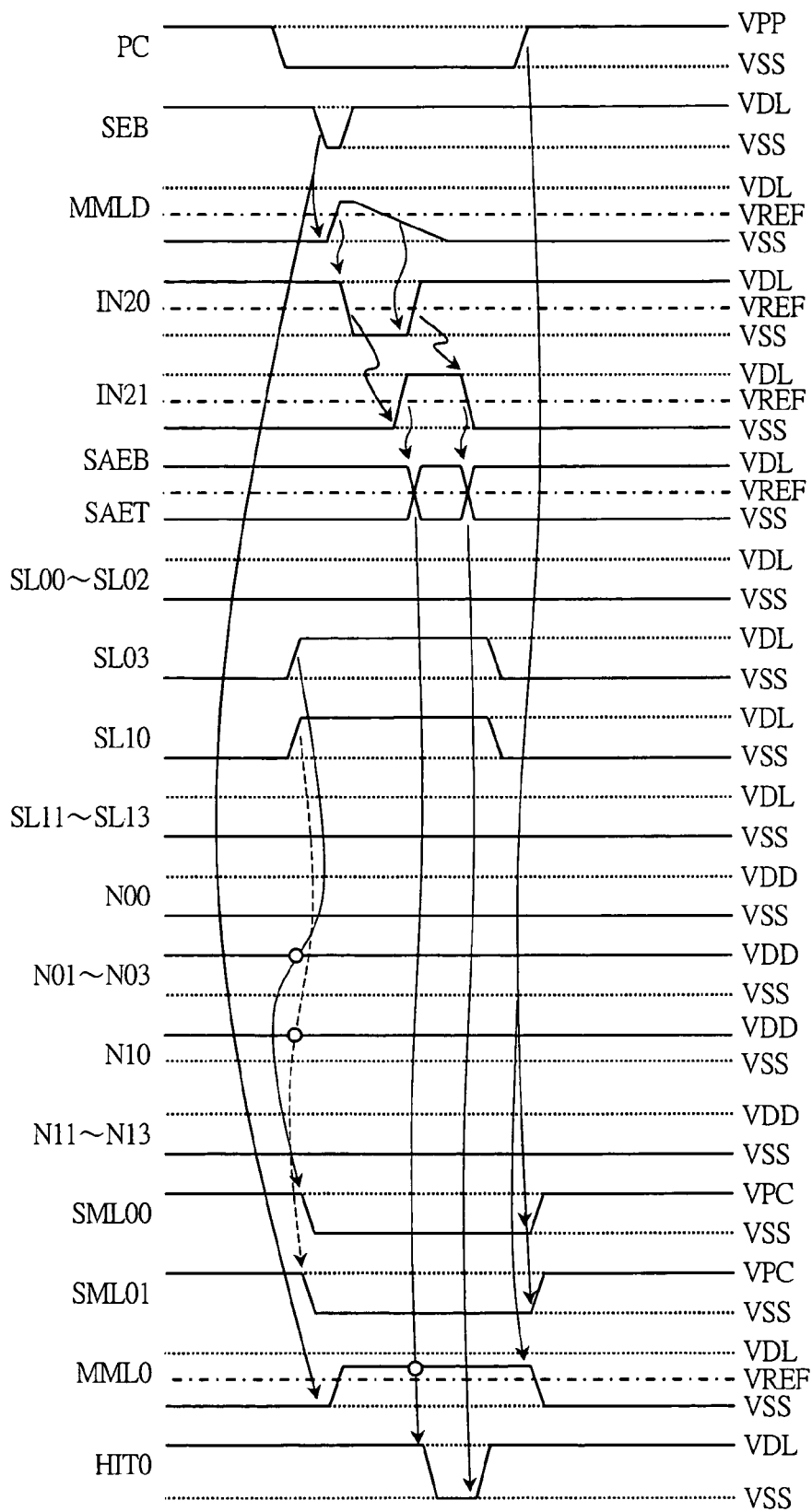
FIG. 13 is a waveform chart showing an example of the search operation in which a matched entry is detected in the sub-array of FIG. 12.

First, the search operation in the case where the search key and the entry are matched will be described with reference to FIG. 13. In this case, in order to simplify the explanation, the memory array shown in FIG. 11 is assumed to have two memory blocks for each one word line. In addition, the entry corresponding to the range of 1 to 3 (decimal system) is stored in the memory block on the relevant word line WL0, and it is assumed that the comparison with the search key corresponding to 3 (decimal system) is to be carried out.

Consequently, in FIG. 11, in accordance with the entry "0001 1110" which is block-encoded for every 2 bits, the memory node N00 in the memory block MB00 and the memory nodes N11 to N13 in the memory block MB01 are held to the ground voltage VSS and the memory nodes N01 to N03 in the memory block MB00 and the memory node N10 in the memory block MB01 are held to the power supply voltage VDD. Furthermore, all of the memory nodes in the memory block on the dummy word line WLD are assumed to be held to the ground voltage VSS.

First, in the standby state, the transistor T201 in the sub-match detector is turned on by driving the pre-charge start signal line PC to the boost voltage VPP. Therefore, the sub-match lines SML00 and SML01 are driven to the pre-charge voltage VPC, respectively. At this time, since the pre-charge voltage VPC is of a voltage level high enough to turn on the transistor T202 in the sub-match detector as described above, the main match line MML0 is driven to the ground voltage VSS.

In addition, since the boost voltage VPP is inputted to the gate electrode of the transistor T201 in the dummy sub-match detector, the transistor T201 is in an turn-on state, and the dummy sub-match lines SMLD0 and SMLD1 are constantly driven to the pre-charge voltage VPC. Consequently, since the transistor T202 in the dummy sub-match detector SMDD0 is turned on, the dummy main match line MMLD is driven to the ground voltage VSS.

When the search operation begins, the pre-charge start signal line PC which is held to the boost voltage VPP is driven to the ground voltage VSS to stop the pre-charge of the sub-match line, and then, the search line which is held to the ground voltage VSS is driven to the array voltage VDL in accordance with the search key. In this drawing, an example is shown, in which, in accordance with the encoded search key "0001 1000", the search lines SL03 and SL10 held to the ground voltage VSS are driven to the array voltage VDL while holding the search lines SL00 to SL02 and SL11 to SL13 to the ground voltage VSS.

At this time, since both transistors T312 and T313 are turned on in the memory cell DMC3 in the memory block MB00 and in the memory cell DMC0 in the memory block MB01, the sub-match lines SML00 and SML01 which are held to the pre-charge voltage VPC are discharged, respectively. Consequently, the transistors T202 in the sub-match detectors SMD00 and SMD01 are cut off. Under this condition, when driving the search enable signal line SEB which is held to the array voltage VDL to the ground voltage VSS, the transistors T211 in the dummy main match detector MMDD and the main match detector MMD110 are turned on. Therefore, the dummy main match line MMLD and the main match line MML0 which are held to the ground voltage VSS are charged to the array voltage VDL at high speed.

Thereafter, the search enable signal SEB which is held to the ground voltage VSS is driven to the array voltage VDL at the timing when the dummy main match line MMLD and the main match line MML0 are charged to a voltage sufficiently higher than the reference voltage VREF. By doing so, the transistor T211 is brought to a cut-off state and the charging is stopped. Then, since the transistor T202 in the dummy sub-match detector SMDD0 is turned on, the voltage of the dummy main match line MMLD is lowered to the ground voltage VSS.

In this event, the dummy main match detector MMDD detects the timing when the voltage of the dummy main match line MMLD becomes lower than the reference voltage VREF, and based on this timing, the clocked inverter circuit CIV21 (sense amplifier SA) in the main match detector MMD110 is activated, and at the same time, the activated time width thereof is determined.

More specifically, the dummy main match detector MMDD of FIG. 12 generates the pulse signals in accordance with the voltage change of the dummy main match line MMLD to the node IN20 via the inverter circuit IV21, and furthermore, it drives the sense amplifier enable signal SAEB which is held to the array voltage VDL to the ground voltage VSS and the sense amplifier enable signal SAET which is held to the ground voltage VSS to the array voltage VDL, respectively, via the NAND circuit ND21. By doing so, the transistor T222 in the main match detector MMD110 is brought to a cut-off state and the clocked inverter CIV21 is activated. At this time, since the main match line MML0 is held to a high voltage, the hit signal node HIT0 which is held to the array voltage VDL is discharged to the ground voltage VSS.

Thereafter, the dummy main match detector MMDD drives the sense amplifier enable signal SAEB which is held to the ground voltage VSS to the array voltage VDL and the sense amplifier enable signal SAET which is held to the array voltage VDL to the ground voltage VSS, respectively, by using the one shot pulse generator so that the clocked inverter CIV21 is brought to an inactive state. Also, since the transistor T222 is turned on, the hit signal node HIT is driven to the array voltage VDL. Furthermore, by driving the pre-charge start signal line PC which is held to the ground voltage VSS to the boost voltage VPP, the sub-match lines SML00 and SML01 are driven to the pre-charge voltage VPC and the main match line MML0 is driven to the ground voltage VSS, thereby returning to the standby state again.

Figure 14:
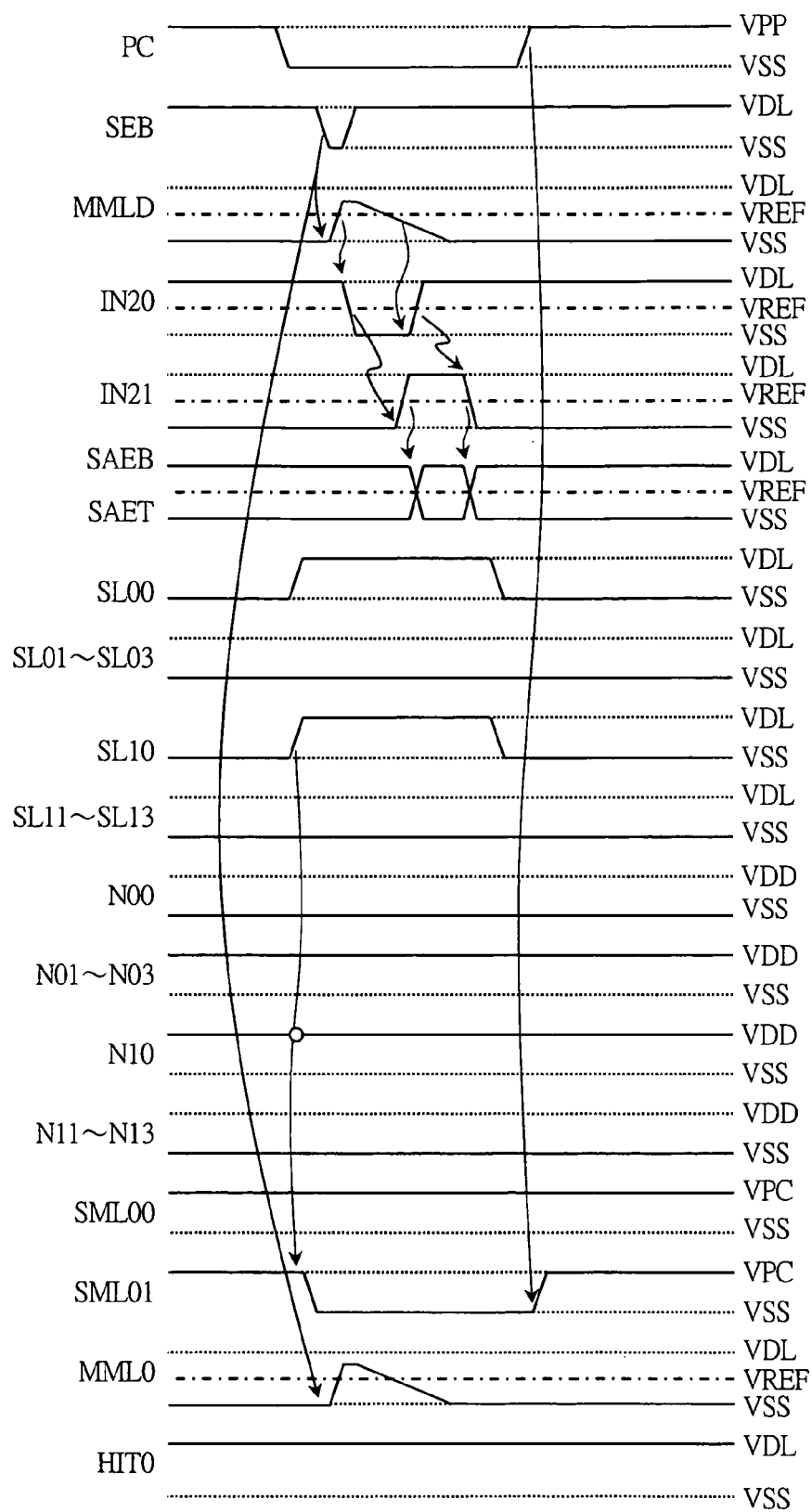
FIG. 14 is a waveform chart showing an example of the search operation in which an unmatched entry is detected in the sub-array of FIG. 12.

Next, the search operation in the case where the search key and the entry are not matched will be described with reference to FIG. 14. In this case, similar to FIG. 13, it is assumed that the entry ("0001 1110") that corresponds to the range of 1 to 3 (decimal system) is stored in the memory block on the word line WL0 and the comparison with the search key corresponding to 0 (decimal system) is to be performed. Note that, since the pre-charge operation and the drive timing of each signal are the same as those in the description of FIG. 13, the description thereof will be omitted below.

When the search operation begins, in accordance with the encoded search key "0001 0001", the search lines SL00 and SL10 which are held to the ground voltage VSS are driven to the array voltage VDL while holding the search lines SL01 to SL03 and SL11 to SL13 to the ground voltage VSS. At this time, since both transistors T312 and T313 are turned on in the memory cell DMC0 in the memory block MB01, the sub-match line SML01 which is held to the pre-charge voltage VPC is discharged.

However, because the transistors which are to be turned on in the memory block MB00 are the transistor T312 in the memory cell DMC0 and the transistors T313 in the memory cells DMC1 to DMC3, no current path is formed between the sub-mach line SML00 and the ground electrode in any of the memory cells. That is, the sub-match line SML00 is held to the pre-charge voltage VPC and the transistor T202 in the sub-match detector SMD00 is held to a turn-on state.

Consequently, since electric charge injected from the transistor T211 when the search enable signal line SEB is activated is discharged from the main match line MML0 via the transistor T202 in the same manner as the dummy main match line MMLD, voltages of the dummy main match line MMLD and the main match line MML0 are suppressed to the level lower than the logical threshold value VREF of the sense amplifier. Consequently, even if the clocked inverter CIV21 in the main match detector MMD110 is activated by the above-mentioned sense amplifier enable signals SAET and SAEB, the hit signal node HIT0 is held to the array voltage VDL.

By the structure and operation as described above, the memory array shown in FIG. 11 and FIG. 12 can achieve the following three effects. First, the gate size of the PMOS transistor T211 in the main match detector MMD110 is designed so that it can have the driving capacity greater than that of the NMOS transistor T202 in the sub-match detector, and the main match line is first driven to a high voltage and then discharged by the transistor T202. By doing so, it becomes possible to generate the voltage signals in accordance with the comparison results between the search key and the entry at high speed to the main match line.

Second, since the dummy memory blocks MDB0 MBD1, . . . , the dummy sub-match detectors SMDD0, SMDD1, . . . , and the dummy main match detector MMDD are disposed and the signals in accordance with the entry of the case where one memory block is not matched are generated to the dummy main match line MMLD, the sense amplifier enable signals SAET and SAEB can be generated at the timing in accordance with the operation of unmatched entries, in which a largest amount of time is required to generate signals. Accordingly, by optimizing the start timing of the sense amplifier enable signals in the above-described manner, it becomes possible to suppress the increase in power consumption due to the excessively fast start timing and the degradation of operation speed due to the excessively slow start timing.

Third, by keeping the output of the clocked inverter CIV21 to the unmatched signal level in a default state, it becomes possible to greatly suppress the power consumption in the search operation. More specifically, in general, only an extremely small number of matched entries exist in the look-up table, and an operation to invert the output is carried out only by the clocked inverter CIV21 which corresponds to the small number of matched entries. Consequently, the power consumption in practical use is limited to the clocked inverter CIV21 corresponding to the matched entries and the latch circuit LA corresponding thereto.

Note that, in FIG. 12, the dummy sub-match detector SMDD0 which is the closest to the dummy main match detector MMDD is used as the dummy sub-match detector which discharges the dummy main match line MMLD. However, the arrangement of the dummy sub-match detector which discharges the dummy main match line MMLD is not limited to this, but various arrangements are possible. In general, since the signal propagation time depends on the distance from a transmitter (or driver, dummy sub-match detector in this case) to a receiver (dummy main match detector MMDD in this case), for example, when a dummy sub-match detector located at a farthermost position of the dummy main match detector MMDD is used as the dummy sub-match detector that discharges the dummy main match line MMLD, it is possible to improve the start timing accuracy of the sense amplifier enable signals SAET and SAEB.

Figure 15:
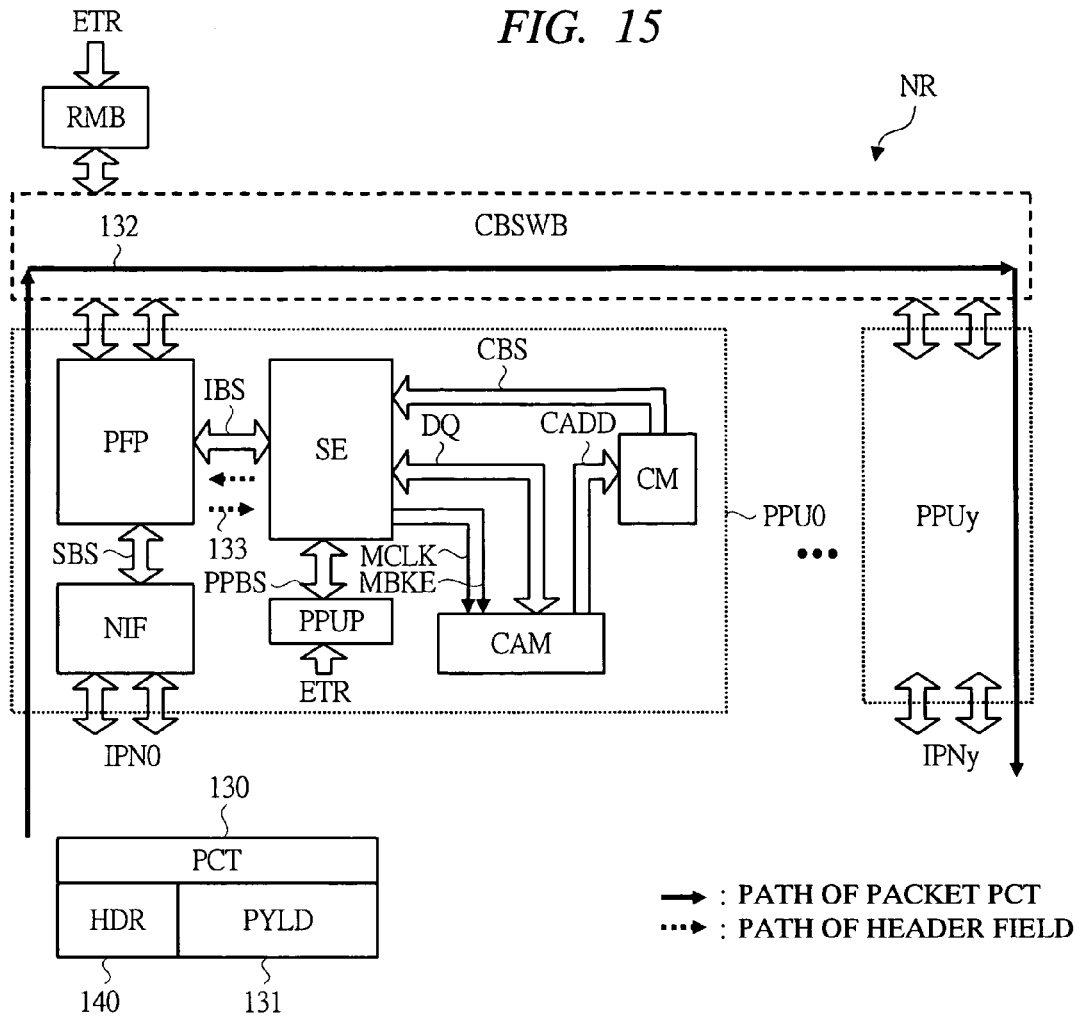
FIG. 15 is an explanatory diagram schematically showing an example of a structure of a router.

In the foregoing, the invention made by the inventors of the present invention has been concretely described based on the embodiments. Lastly, an example of the structure of a network router NR using the CAM according to the present invention will be described with reference to FIG. 15. In FIG. 15, to simplify the explanation, a router manager block RMB, a crossbar switch block CBSWB, and packet processor-units PPU0 to PPUy are shown as the principal blocks.

The router manager block RMB is composed of a plurality of central processing units (CPU) and performs the overall setting and control of the network router. The crossbar switch block CBSWB connects desired packet processor units in accordance with the transfer path of the packets to be processed. The packet processor units PPU0 to PPUy are the blocks which transfer the packets between the corresponding networks IPN0 to IPNy, respectively.

Figure 16:
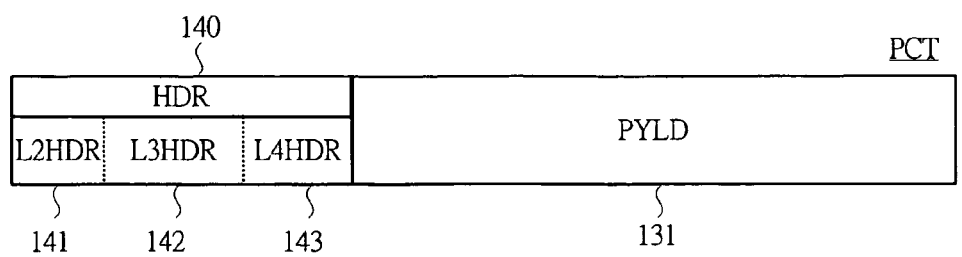
FIG. 16 is an explanatory diagram schematically showing an example of a structure of a packet transferred by the router of FIG. 15.

Note that a reference numeral 130 schematically denotes a packet PCT processed by this network router. The packet PCT is broadly divided into two fields. One field denoted by a reference numeral 140 is a header field HDR, and the other field denoted by a reference numeral 131 is a payload field PYLD. Further, the header field 140 is composed of a plurality (three in this case) of fields 141, 142, and 143 as shown in FIG. 16.

The field 141 is a second-layer header L2HDR and has a source address media access control, a destination address media access control, and others. The field 142 is a third-layer header L3HDR and has a source IP address, a destination IP address, and others. The field 143 is a fourth-layer header L4HDR and has a source port, a destination port, and others which indicate protocol, that is, host application.

The payload field PYLD has information designated by a sender such as e-mail text, text file, and the like. Note that an arrow mark 132 shown in FIG. 15 is a transfer path of the packet PCT, and an arrow mark 133 is a transfer path of the header field. In the following, the structure of the packet processor units PPU0 to PPUy will be described in detail while focusing on the paths.

Each of the packet processor units PPU0 to PPUy is composed of a network interface NIF, a packet forwarding processor PFP, a search engine SE, a content addressable memory CAM according to the present embodiment, a content memory CM in which a DRAM or the like is used, a central processing unit for packet processor unit PPUP, and others.

The network interface NIF and the packet forwarding processor PFP are connected through a system bus SBS. The packet forwarding processor PFP and the search engine SE are connected through an internal bus IBS. The search engine SE and the content addressable memory CAM are connected through a data bus DQ, a master clock MCLK, and a multi bank enable signal MBKE, and the search engine SE and the content memory CM are connected through a content data bus CBS. The content addressable memory CAM and the content memory CM are connected through a content address bus CADD.

The router NR performs the transmission and reception of packets PCT between, for example, the internet IPN0 and the packet processing unit PPU0 via the network interface NIF. The packet forwarding processor PFP deciphers the content of the received packet and transfers the header field HDR to the search engine SE while holding the payload field PYLD thereof. The search engine SE extracts the desired information from the header field by using the central processing unit for packet processing unit PPUP connected via the packet processing bus PPBS and transfers it to the content addressable memory CAM as a search key.

As described in the first embodiment and the second embodiment, the content addressable memory CAM receives the search key in synchronization with the master clock MCLK and carries out the search operation in the mode in accordance with the multi bank enable signal MBKE. In the content addressable memory CAM, a large number of entries composed of information of the same format as the search key are stored, and an address corresponding to the matched entry is generated by the search operation. When this address is inputted into the content memory CM via the content address bus CADD, the information of the relevant entry is read from the content memory CM and transferred to the packet forwarding processor PFP via the search engine SE.

The information read here is, for example, transfer control information in which the optimum path information to the destination and others are contained. The packet forwarding processor PFP rewrites the content of the header field HDR on the basis of this transfer control information and reconstructs the packet PCT together with the above-mentioned payload field PYLD. Then, this packet PCT is transferred from the crossbar switch block CBSWB to the network connected to the network router which is the next relay point via the designated packet processing unit.

In the structure of the router NR as described above, the search key is generated by the use of the search engine SE and the central processing unit for packet processor unit PPUP. On the other hand, the entry stored in the content addressable memory CAM is generated and registered while analyzing the information ETR set by an administrator of the router NR by using the router manager block RMB or the central processing unit for packet processor unit PPUP.

In the foregoing, the invention made by the inventors of the present invention has been concretely described based on the embodiments. However, it is needless to say that the present invention is not limited to the foregoing embodiments and various modifications and alterations can be made within the scope of the present invention.

For example, the CAM according to the present invention is not limited to an off-chip, that is, single-unit device, but can be applied to a CAM block mounted on a system LSI called as a system on chip (SoC), and the same effects as those in the embodiments described above can be obtained. In addition, the structure other than that based on the DRAM cells of FIG. 3 may be used for the memory cell. For example, since the manufacturing process of the CAM can be simplified when the SRAM cells are used instead of the DRAM cells, the unit cost of a chip can be reduced.

As another example, it is also possible to apply a flash memory, a ferroelectric RAM (random access memory), a MRAM (magnetoresistive random access memory), and other memory cells. In such an event, since all of them have a nonvolatile memory cell structure, the search operation can be resumed in a short time even when power supply interruption occurs.

In addition, in FIG. 3 and FIG. 12, a memory cell structure in which the NMOS transistors T312 and T313 are connected in series in this order between the sub-match line and the ground electrode has been shown, but the same search operation can be performed even if the order of the transistors is reversed. Furthermore, in FIG. 1 and FIG. 8, the structure provided with encoder blocks and decoder blocks that correspond to ternary data and quaternary data has been shown. However, the structure of the peripheral circuits is not limited to this, but various modifications are possible as long as the CAM can process the one-hot-spot block encoded entry and search key. For example, as shown in FIG. 8 of reference document 1, the same effects can be obtained even in the circuit structure in which compression circuits and extension circuits are provided in the chip.

Note that, in the embodiments described above, with using the memory block shown in FIG. 2 and FIG. 3 as an example, a CAM structure in which the search key and entry are encoded for every 2 bits and then searched and stored has been shown. However, the CAM structure is not limited to this, but the number of encoded bits may be 3 bits or more as shown in FIG. 21 of reference document 1. For example, in the case of the encoding for every 3 bits, a the structure composed of eight memory cells is adopted for the memory block as shown in FIG. 12 of reference document 1, and accordingly, the width of buses which transmit the encoded data such as the encoded data bus, global IO, and the like are expanded. By using the structure as described above, the amount of information per one entry is improved, and the CAM having an effectively large capacity can be achieved.

In addition, the CAM structure which achieves the interleave operation described in the first embodiment and the second embodiment can be applied to the ternary CAM, too. More specifically, as shown in FIG. 4 of reference document 1, since the structure of the ternary CAM cell is obtained by combining the two memory cells shown in FIG. 2 and FIG. 3 of the present specification, high-reliability and high-speed ternary CAM can be achieved by performing accurate reading and refresh operations with using the structure shown in FIG. 4 and FIG. 5.

Since the memory arrays divided into multiple banks are operated in an interleave mode, the semiconductor device according to the present invention can receive the search key in a cycle faster than the search operation cycle of the memory array and can perform the search without delay. Also, it is suitable for the network router technology which carries out the table search without controlling the rapidly increasing line speed.

What is claimed is:

1. A semiconductor device comprising: a first bank; a second bank; and buses connected to said first bank and said second bank,
    wherein each of said first and second banks has a first CAM array, a second CAM array, a sense amplifier block which is disposed between said first CAM array and said second CAM array, a read circuit block, a write circuit block, and a search line driver block,
    said first and second CAM arrays have multiple bit lines, multiple search lines disposed in parallel to said multiple bit lines, multiple word lines which orthogonally intersect said multiple bit lines, and multiple CAM cells disposed at intersections between said multiple bit lines and said multiple word lines, respectively, said sense amplifier block has multiple sense amplifiers as many as the number of bit lines included in said first or second CAM array, said read circuit block has multiple read circuits as many as the number of bit lines included in said first or second CAM array, said write circuit block has multiple write circuits as many as the number of bit lines included in said first or second CAM array, said search line driver block has multiple search line drivers as many as the number of search lines included in said first or second CAM array, each of said multiple sense amplifiers is connected to one of said multiple bit lines included in said first CAM array and one of said multiple bit lines included in said second CAM array, said bit lines which form a pair and are connected to each of said multiple sense amplifiers are connected to said bus via any one of said multiple read circuits and any one of said multiple write circuits, and said multiple search lines are connected to said bus via said multiple search line drivers.

2. The semiconductor device according to claim 1, wherein said first bank is activated in synchronization with a first clock, said second bank is activated in synchronization with a second clock, phases of said first clock and said second clock differ from each other, and said first bank and said second bank perform a search operation at different phases.

3. The semiconductor device according to claim 2, wherein said bus is connected to an encoder and a decoder, said encoder converts ternary data based on a first mapping or quaternary data based on a second mapping into encoded data and outputs it to said bus, and said decoder converts the encoded data read from said first and second banks and inputted via said bus into ternary data based on the first mapping or quaternary data based on the second mapping.

4. A semiconductor device, comprising:
multiple bit lines;
multiple search lines provided so as to correspond to said multiple bit lines and disposed in parallel to said multiple bit lines;
multiple word lines which intersect said multiple bit lines;
multiple memory cells disposed at intersections between said multiple bit lines and said multiple word lines;
multiple main match lines provided so as to correspond to said multiple word lines and disposed it parallel to said multiple word lines;
multiple sub-match lines provided so as to correspond to said multiple main match lines and disposed in parallel to said multiple main match lines, each of said sub-match lines being connected to a predetermined number of memory cells of said multiple memory cells;
multiple sub-match detectors connected between said multiple sub-match lines and any of the main match lines which correspond to said multiple sub-match lines; and
multiple main-match detectors connected to said multiple main match lines and each including a sense amplifier,
wherein information inputted via said multiple search lines is compared with information stored in said multiple memory cells, and the comparison results are amplified by sense amplifiers in said multiple main match detectors, and
in a search operation, said multiple main match detectors first charge said multiple main match lines to voltages higher than logic threshold values of said multiple sense amplifiers, and after said charging is stopped, said main match detectors start said multiple sense amplifiers at the time when said multiple main match lines become voltages lower than the logic threshold values of said multiple sense amplifiers due to the discharge by multiple sub-match detectors.

5. The semiconductor device according to claim 4, further comprising:
a dummy main match line disposed in parallel to said multiple word lines;
multiple dummy sub-match lines provided so as to correspond to said dummy main match line and disposed in parallel to said dummy main match line;
multiple dummy sub-match detectors respectively connected between said multiple dummy sub-match lines and said dummy main match line; and
a dummy main match detector connected to said dummy main match line,
wherein said multiple dummy sub-match detectors have the same structure as said multiple sub-match detectors,
said dummy main match detector has a sense amplifier having the same structure as that of said multiple main match detectors,
said dummy main match detector and said multiple main match detectors are connected through sense amplifier enable signal lines, and
in a search operation, said dummy main match detector charges said dummy main match line to a voltage higher than a logic threshold value of said sense amplifier at the same timing and driving capability as those of said multiple main match detectors, and after said charging is stopped, said dummy main match detector generates a start signal of said sense amplifier at the time when said dummy main match line becomes a voltage lower than the logic threshold value of said sense amplifier due to the discharge by a predetermined dummy sub-match detector of said multiple dummy sub-match detectors.

* * * * *